United States Patent
Ganguli et al.

(10) Patent No.: US 7,910,165 B2
(45) Date of Patent: *Mar. 22, 2011

(54) RUTHENIUM LAYER FORMATION FOR COPPER FILM DEPOSITION

(75) Inventors: Seshadri Ganguli, Sunnyvale, CA (US); Kavita Shah, Mountain View, CA (US); Nirmaya Maity, Los Altos, CA (US); Mei Chang, Saratoga, CA (US)

(73) Assignee: Applied Materials, Inc., Santa Clara, CA (US)

(*) Notice: Subject to any disclaimer, the term of this patent is extended or adjusted under 35 U.S.C. 154(b) by 1955 days.

This patent is subject to a terminal disclaimer.

(21) Appl. No.: 10/811,230

(22) Filed: Mar. 26, 2004

(65) Prior Publication Data

US 2004/0241321 A1    Dec. 2, 2004

Related U.S. Application Data

(63) Continuation-in-part of application No. 10/634,662, filed on Aug. 4, 2003, now Pat. No. 7,264,846, which is a continuation-in-part of application No. 10/443,648, filed on May 22, 2003, now Pat. No. 7,404,985.

(60) Provisional application No. 60/385,499, filed on Jun. 4, 2002.

(51) Int. Cl.
C23C 16/00 (2006.01)

(52) U.S. Cl. ............... 427/248.1; 427/255.23; 427/255.7

(58) Field of Classification Search ............... 427/248.1, 427/255.23, 255.7, 255.28
See application file for complete search history.

(56) References Cited

U.S. PATENT DOCUMENTS

| | | | |
|---|---|---|---|
| 5,372,849 A | 12/1994 | McCormick et al. |
| 5,933,753 A | 8/1999 | Simon et al. |
| 5,962,716 A | 10/1999 | Uhlenbrock et al. |
| 6,063,705 A | 5/2000 | Vaartstra |
| 6,114,557 A | 9/2000 | Uhlenbrock et al. |
| 6,338,991 B1 | 1/2002 | Zhang et al. |
| 6,365,502 B1 | 4/2002 | Paranjpe et al. |
| 6,423,619 B1 | 7/2002 | Grant et al. |

(Continued)

FOREIGN PATENT DOCUMENTS

EP    1 293 509    9/2002

(Continued)

OTHER PUBLICATIONS

Aaltonen, et al., "Atomic Layer Deposition of Ruthenium from $RuCp_2$ and Oxygen: Film Growth and Reaction Mechanism Studies," Electrochemical Society Proceedings Volume Aug. 2003 pp. 946-953.

(Continued)

*Primary Examiner* — Timothy H Meeks
*Assistant Examiner* — Kelly M Gambetta
(74) *Attorney, Agent, or Firm* — Patterson & Sheridan, LLP (57) ABSTRACT

A method of ruthenium layer formation for high aspect ratios, interconnect features is described. The ruthenium layer is formed using a cyclical deposition process. The invention generally provides a method of forming a film on a substrate surface including positioning a substrate within a process chamber, exposing a ruthenium-containing compound to the substrate surface, purging the process chamber with a purge gas, reducing the ruthenium-containing compound with a reductant to form a ruthenium layer on the substrate surface and purging the process chamber with the purge gas. The ruthenium-containing compound is selected from the group consisting of bis(dialkylpentadienyl)ruthenium compounds, bis(alkylpentadienyl) ruthenium compounds, bis(pentadienyl)ruthenium compounds, and combinations thereof.

55 Claims, 5 Drawing Sheets

U.S. PATENT DOCUMENTS

| | | | |
|---|---|---|---|
| 6,440,495 B1 | 8/2002 | Wade et al. | |
| 6,462,367 B2 | 10/2002 | Marsh et al. | |
| 6,479,100 B2 | 11/2002 | Jin et al. | |
| 6,482,740 B2 | 11/2002 | Soininen et al. | |
| 6,517,616 B2 | 2/2003 | Marsh et al. | |
| 6,527,855 B2* | 3/2003 | DeLaRosa et al. | 117/89 |
| 6,541,067 B1 | 4/2003 | Marsh et al. | |
| 6,576,778 B1 | 6/2003 | Uhlenbrock et al. | |
| 6,580,111 B2 | 6/2003 | Kim et al. | |
| 6,596,602 B2 | 7/2003 | Iizuka et al. | |
| 6,605,735 B2* | 8/2003 | Kawano et al. | 556/136 |
| 6,610,568 B2 | 8/2003 | Marsh et al. | |
| 6,617,634 B2 | 9/2003 | Marsh et al. | |
| 6,627,995 B2 | 9/2003 | Paranjpe et al. | |
| 6,713,373 B1 | 3/2004 | Omstead | |
| 6,737,317 B2 | 5/2004 | Marsh et al. | |
| 6,743,739 B2 | 6/2004 | Shimamoto et al. | |
| 6,744,138 B2 | 6/2004 | Marsh | |
| 6,780,758 B1 | 8/2004 | Derderian et al. | |
| 6,790,773 B1 | 9/2004 | Drewery et al. | |
| 6,800,542 B2 | 10/2004 | Kim | |
| 6,800,937 B2 | 10/2004 | Marsh et al. | |
| 6,887,795 B2 | 5/2005 | Soininen et al. | |
| 2001/0006838 A1 | 7/2001 | Won et al. | |
| 2001/0054730 A1 | 12/2001 | Kim et al. | |
| 2002/0000587 A1 | 1/2002 | Kim et al. | |
| 2002/0004293 A1 | 1/2002 | Soininen et al. | |
| 2002/0025627 A1 | 2/2002 | Marsh et al. | |
| 2002/0028556 A1 | 3/2002 | Marsh et al. | |
| 2002/0074577 A1 | 6/2002 | Marsh et al. | |
| 2002/0076881 A1 | 6/2002 | Marsh et al. | |
| 2002/0081381 A1 | 6/2002 | DeLaRosa et al. | |
| 2002/0102810 A1 | 8/2002 | Iizuka et al. | |
| 2002/0121697 A1 | 9/2002 | Marsh | |
| 2002/0125516 A1 | 9/2002 | Marsh et al. | |
| 2002/0173054 A1* | 11/2002 | Kim | 438/3 |
| 2003/0096468 A1 | 5/2003 | Soininen et al. | |
| 2003/0165615 A1* | 9/2003 | Aaltonen et al. | 427/79 |
| 2003/0212285 A1 | 11/2003 | Uhlenbrock et al. | |
| 2004/0005753 A1 | 1/2004 | Kostamo et al. | |
| 2004/0038529 A1 | 2/2004 | Soininen et al. | |
| 2004/0105934 A1 | 6/2004 | Chang et al. | |
| 2004/0108217 A1 | 6/2004 | Dubin | |
| 2004/0241321 A1 | 12/2004 | Ganguli et al. | |
| 2005/0006799 A1 | 1/2005 | Gregg et al. | |
| 2005/0081882 A1 | 4/2005 | Greer et al. | |

FOREIGN PATENT DOCUMENTS

| | | |
|---|---|---|
| JP | 2001-111000 | 4/2001 |
| JP | 2001-237400 | 8/2001 |
| WO | WO 01/88972 | 11/2001 |
| WO | WO 03/056612 | 7/2003 |
| WO | WO 2005/020317 | 3/2005 |

OTHER PUBLICATIONS

Aaltonen, et al., "Atomic Layer Deposition of Ruthenium Thin Films from Ru(thd)$_3$ and Oxygen," Chem. Vap. Deposition (2004), 10, No. 4 pp. 215-219.

Aaltonen, et al., "Ruthenium Thin Films Grown by Atomic Layer Deposition," Chem. Vap. Deposition (2003), 9, No. 1 pp. 45-49.

Aoyama, et al.; "Ruthenium Films Prepared by Liquid Source Chemical Vapor Deposition Using Bis-(ethylcyclopentadienyl)ruthenium," Jpn. J. Appl. Phys. vol. 38 (1999) pp. L1134-L1136.

Dadgar, et al., "Growth of Ru doped semi-insulating InP by low pressure metalorganic chemical vapor deposition," Journal of Crystal Growth 195 (1998) pp. 69-73.

Kwon, at al., "Atomic Layer Deposition of Ruthenium Thin Films for Copper Glue Layer," Journal of the Electrochemical Society, 151 (2) (2004) pp. G109-G112.

Kwon, et al., "Plasma-Enhanced Atomic Layer Deposition of Ruthenium Thin Films," Electrochemical and Solid-State Letters, 7 (4) (2004) pp. C46-C48.

Lashdaf, et al., "Deposition of palladium and ruthenium β-diketonates on alumina and silica supports in gas and liquid phase," Applied Catalysis A: General 241 (2003) pp. 51-63.

Lim, et al., "Atomic layer deposition of transition metals," Nature Materials, vol. 2 Nov. 2003 pp. 749-754.

Shibutami, et al., "A Novel Ruthenium Precursor for MOCVD without Seed Ruthenium Layer," TOSOH Research & Technology Review, vol. 47 (2003) pp. 61-64.

International Search Report dated Mar. 11, 2005 regarding International Application No. PCT/US2004/024805.

International Search Report dated Jul. 29, 2005 regarding International Application No. PCT/US2005/010203.

Meda, et al. "Chemical Vapor Deposition of Ruthenium Dioxide Thin Films From Bis(2, 4-dimethylpentadienyl) Ruthenium," Chemical Aspects of Electronic Ceramics Processing, Symposium Mater. Res. Soc., Warrendale, PA, USA, 1998, pp. 75-80, XP009050315, ISBN: 1-55899-400-9.

Final Office Action for U.S. Appl. No. 11/336,527 dated Mar. 20, 2009.

* cited by examiner

RUTHENIUM LAYER FORMATION FOR COPPER FILM DEPOSITION

CROSS-REFERENCE TO RELATED APPLICATIONS

This application is a continuation-in-part of U.S. Ser. No. 10/634,662, filed Aug. 4, 2003, and issued as U.S. Pat. No. 7,264,846, which is a continuation-in-part of U.S. Ser. No. 10/443,648, filed May 22, 2003, now U.S. Pat. No. 7,404,985 which claims benefit of U.S. Ser. No. 60/385,499, filed Jun. 4, 2002, which are herein incorporated by reference.

BACKGROUND OF THE INVENTION

1. Field of the Invention

Embodiments of the present invention generally relate to a method of ruthenium layer formation and, more particularly to methods of ruthenium layer formation for use in copper integration.

2. Description of the Related Art

Sub-quarter micron, multi-level metallization is one of the key technologies for the next generation of very large scale integration (VLSI) and ultra large scale integration (ULSI) semiconductor devices. The multilevel interconnects that lie at the heart of this technology require the filling of contacts, vias, lines, and other features formed in high aspect ratio apertures. Reliable formation of these features is very important to the success of both VLSI and ULSI as well as to the continued effort to increase client density and quality on individual substrates and die.

As circuit densities increase, the widths of contacts, vias, lines and other features, as well as the dielectric materials between them may decrease to less than about 250 nm, whereas the thickness of the dielectric layers remains substantially constant with the result that the aspect ratios for the features, i.e., their height divided by width, increases. Many conventional deposition processes have difficulty filling structures where the aspect ratio exceeds 6:1, and particularly where the aspect ratio exceeds 10:1. As such, there is a great amount of ongoing effort being directed at the formation of void-free, nanometer-sized structures having aspect ratios wherein the ratio of feature height to feature width can be 6:1 or higher.

Additionally, as the feature widths decrease, the device current typically remains constant or increases, which results in an increased current density for such feature. Elemental aluminum and aluminum alloys have been the traditional metals used to form vias and lines in semiconductor devices because aluminum has a perceived low electrical resistivity, superior adhesion to most dielectric materials, ease of patterning, and the ability to obtain aluminum in a highly pure form. However, aluminum has a higher electrical resistivity than other more conductive metals such as copper. Aluminum can also suffer from electromigration leading to the formation of voids in the conductor.

Copper and copper alloys have lower resistivities than aluminum, as well as a significantly higher electromigration resistance compared to aluminum. These characteristics are important for supporting the higher current densities experienced at high levels of integration and increased device speed. Copper also has good thermal conductivity. Therefore, copper is becoming a choice metal for filling sub-quarter micron, high aspect ratio interconnect features on semiconductor substrates.

A thin film of a noble metal such as, for example, palladium, platinum, cobalt, nickel and rhodium, among others may be used as an underlayer for the copper vias and lines. Such noble metals, which are resistant to corrosion and oxidation, may provide a smooth surface upon which a copper seed layer is subsequently deposited using for example, an electrochemical plating (ECP) process.

The noble metal is typically deposited using a chemical vapor deposition (CVD) process or a physical vapor deposition (PVD) process. Unfortunately, noble metals deposited on high aspect ratio interconnect features using CVD and/or PVD processes generally have poor step coverage (e.g., deposition of a non-continuous material layer). The poor step coverage for the noble metal material layer may cause the subsequent copper seed layer deposition using an ECP process to be non-uniform.

Atomic layer deposition (ALD) processes generally provide high step coverage for deposition of transition metals, such as titanium, tungsten and tantalum, but has not been used as successfully for deposition of noble metals. For Ru-ALD processes, ruthenium layers have been deposited by using various ruthenocene compounds (ruthenium-containing metallocenes), such as bis(ethylcyclopentadienyl)ruthenium, bis(cyclopentadienyl)ruthenium and bis(pentamethylcyclopentadienyl)ruthenium. However, Ru-ALD processes using ruthenocene compounds generally require particular process conditions, such as hydroxylated (—OH) or electron-rich (e.g., metallic) surfaces and absorption temperatures above 400° C. Ruthenium-ALD processes with ruthenocene precursors generally deposit ruthenium layers having an increased electrical resistivity due to unevenness of the layer. Further, ruthenocene precursors used during Ru-ALD to deposit ruthenium on dielectric surfaces tend to fail the tape test due to low adhesion properties.

Therefore, a need exists in the art, for a method to deposit ruthenium metals in high aspect ratio interconnect features or dielectric surfaces having good step coverage, strong adhesion and low electrical resistivity.

SUMMARY OF THE INVENTION

A method of ruthenium layer formation for high aspect ratio interconnect features is described. The ruthenium layer is formed using a cyclical deposition process, such as atomic layer deposition (ALD). The cyclical deposition process comprises alternately exposing a ruthenium-containing compound and a reducing gas to a substrate structure. The adsorbed ruthenium-containing compound reacts with reducing gas to form the ruthenium layer on the substrate. The substrate may contain barrier layers and/or dielectric layers, such as low-k and high-k materials.

The ruthenium layer formation is compatible with integrated circuit fabrication processes. In one integrated circuit fabrication process, the ruthenium layer may be used as an underlayer for a copper seed layer in a copper interconnect. For such an embodiment, a preferred process sequence includes providing a substrate having an interconnect pattern defined in one or more dielectric layers formed thereon. The interconnect pattern includes a barrier layer conformably deposited thereon. A ruthenium layer is conformably deposited on the barrier layer. The ruthenium layer is deposited using a cyclical deposition process by alternately exposing a ruthenium-containing compound and a reducing gas to the substrate. Thereafter, the copper interconnect is completed by depositing a copper seed layer on the ruthenium layer and filling the interconnects with bulk copper metal.

In another integrated circuit fabrication process, the ruthenium layer may be deposited on a dielectric material, such as a low-k material. For such an embodiment, a preferred process sequence includes providing a substrate having an interconnect pattern defined in one or more dielectric layers formed thereon. A ruthenium layer is conformably deposited on the dielectric layer. The ruthenium layer is deposited using a cyclical deposition process by alternately exposing a ruthenium-containing compound and a reducing gas to the substrate.

In one embodiment, the invention generally provides a method of forming a film on a substrate surface including positioning a substrate within a process chamber, exposing a ruthenium-containing compound to the substrate surface, purging the process chamber with a purge gas, reducing the ruthenium-containing compound with a reductant to form a ruthenium layer on the substrate surface and purging the process chamber with the purge gas. The ruthenium-containing compound is preferably selected from the group consisting of bis(dialkylpentadienyl)ruthenium compounds, bis(alkylpentadienyl)ruthenium compounds, bis(pentadienyl)ruthenium compounds, and combinations thereof.

In another embodiment, the invention generally provides a method for forming a layer comprising ruthenium on a substrate surface within a process chamber sequentially including: a) exposing the substrate surface to bis(2,4-dimethylpentadienyl)ruthenium to form a ruthenium-containing layer on the substrate surface; b) purging the process chamber with a purge gas; c) reacting a reducing gas with the ruthenium-containing layer; and d) purging the process chamber with the purge gas.

In another embodiment, the invention generally provides a method of forming a ruthenium layer on a substrate for use in integrated circuit fabrication including depositing a barrier layer to a substrate surface by a first ALD process, wherein the barrier layer is selected from the group consisting of tantalum, tantalum nitride, tantalum silicon nitride, titanium, titanium nitride, titanium silicon nitride, tungsten, tungsten nitride and combinations thereof and depositing the ruthenium layer to the barrier layer by a second ALD process. The second ALD process includes exposing the barrier layer to a ruthenium-containing compound within a process chamber, chemisorbing a ruthenium-containing layer to the barrier layer, exposing the ruthenium-containing layer to a reducing gas and reacting the reducing gas with the ruthenium-containing layer to form the ruthenium layer on the barrier layer.

In another embodiment, the invention generally provides a method of forming a ruthenium film on a dielectric material on a substrate including positioning the substrate within a process chamber, exposing a ruthenium-containing compound to the dielectric material, purging the process chamber with a purge gas, reducing the ruthenium-containing compound with a reductant to form the ruthenium layer on the dielectric material and purging the process chamber with the purge gas. The ruthenium-containing compound is selected from the group consisting of bis(dialkylpentadienyl)ruthenium compounds, bis(alkylpentadienyl)ruthenium compounds, bis(pentadienyl)ruthenium compounds, and combinations thereof.

In another embodiment, the invention generally provides a method of forming a ruthenium layer on a substrate surface including positioning a substrate within a process chamber, exposing the substrate surface to a ruthenium-containing compound, forming a ruthenium-containing compound film on the substrate surface, purging the process chamber with a purge gas, reducing the ruthenium-containing compound film with a reductant and purging the process chamber with the purge gas. The ruthenium-containing compound includes ruthenium and at least one open chain dienyl ligand and the reductant comprises at least one reagent selected from the group consisting of oxygen, nitrous oxide, nitric oxide, nitrogen dioxide, and combinations.

In another embodiment, the invention generally provides a method of forming a ruthenium layer on a low-k material including positioning a substrate containing the low-k material within a process chamber and maintaining the substrate at a temperature in a range from about 200° C. to about 400° C. The method further includes exposing the low-k material with a ruthenium-containing compound comprising ruthenium and at least one open chain dienyl ligand, forming a ruthenium-containing compound film on the low-k material, purging the process chamber with a purge gas, reducing the ruthenium-containing compound film with a reductant comprising an oxygen-containing gas and purging the process chamber with the purge gas.

In another embodiment, the invention generally provides a method of forming a ruthenium-containing layer on a low-k material including positioning a substrate containing the low-k material within a process chamber and maintaining the substrate at a temperature in a range from about 200° C. to about 400° C. The method further includes exposing the low-k material to bis(2,4-dimethylpentadienyl)ruthenium to form a ruthenium-containing compound film, purging the process chamber with a purge gas, reducing the ruthenium-containing compound film with a gas comprising oxygen and purging the process chamber with the purge gas.

In another embodiment, the invention generally provides a method of forming a ruthenium-containing layer on a copper-barrier material including positioning a substrate containing a tantalum-containing material within a process chamber and maintaining the substrate at a temperature in a range from about 200° C. to about 400° C. The method further includes exposing the tantalum-containing material to bis(2,4-dimethylpentadienyl)ruthenium to form a ruthenium-containing compound film, purging the process chamber with a purge gas, reducing the ruthenium-containing compound film with a gas comprising oxygen and purging the process chamber with the purge gas.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
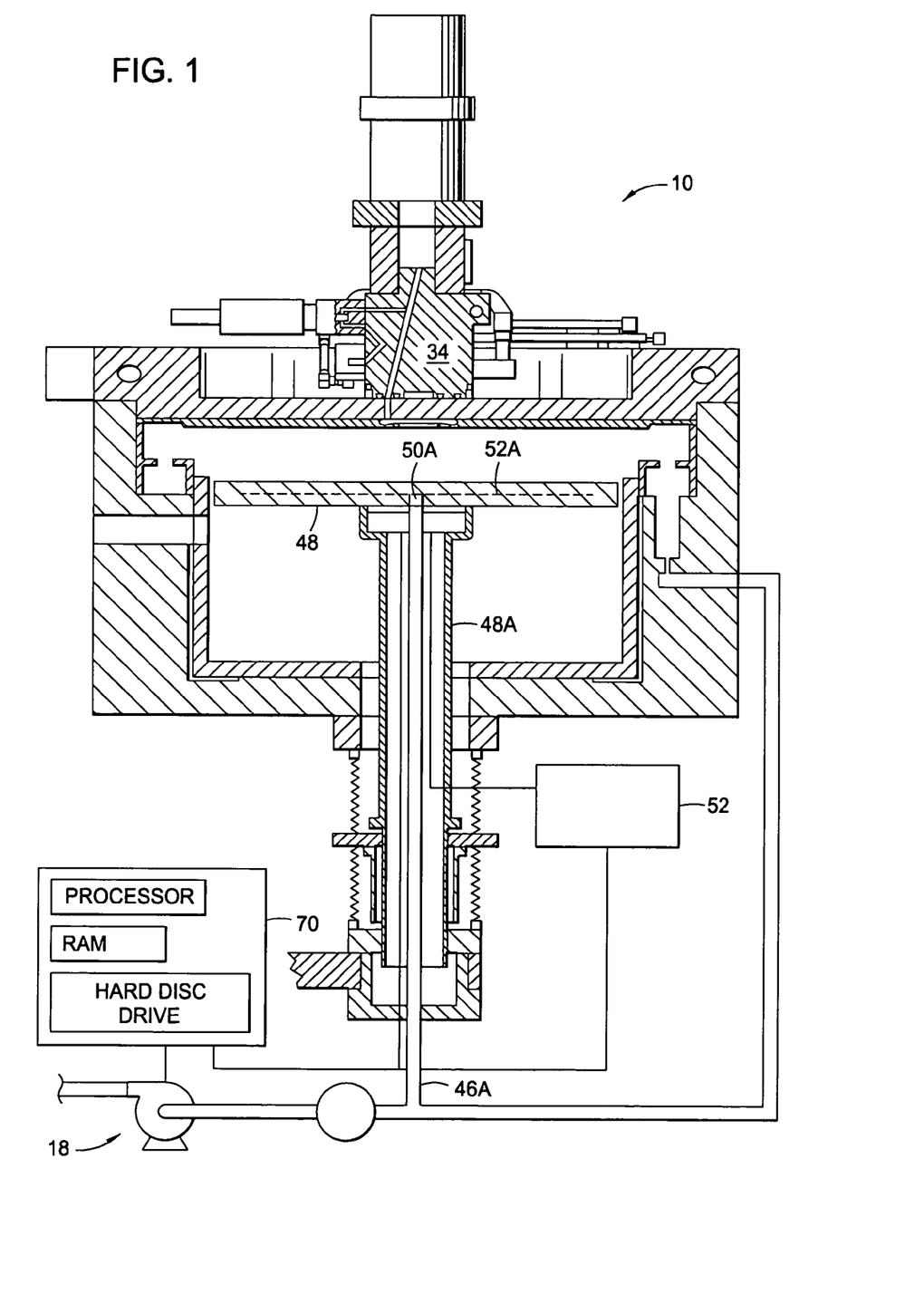
FIG. 1 depicts a schematic cross-sectional view of a process chamber that can be used to perform a cyclical deposition process described herein.

FIG. 1 depicts a schematic cross-sectional view of a process chamber 10 that can be used to perform integrated circuit fabrication in accordance with embodiments described herein. The process chamber 10 generally houses a substrate support pedestal 48, which is used to support a substrate (not shown). The substrate support pedestal 48 is movable in a vertical direction inside the process chamber 10 using a displacement mechanism 48A.

Depending on the specific process, the substrate can be heated to some desired temperature prior to or during deposition. For example, the substrate support pedestal 48 may be heated using an embedded heating element 52A. The substrate support pedestal 48 may be resistively heated by applying an electric current from an AC power supply 52 to the heating element 52A. The substrate (not shown) is, in turn, heated by the support pedestal 48. Alternatively, the substrate support pedestal 48 may be heated using radiant heaters such as, for example, lamps (not shown).

A temperature sensor 50A, such as a thermocouple, is also embedded in the substrate support pedestal 48 to monitor the temperature of the pedestal 48 in a conventional manner. The measured temperature is used in a feedback loop to control the AC power supply 52 for the heating element 52A, such that the substrate temperature can be maintained or controlled at a desired temperature which is suitable for the particular process application.

A vacuum pump 18 and the conduit system 46A are used to evacuate the process chamber 10 and to maintain the pressure inside the process chamber 10. A gas manifold 34, through which process gases are introduced into the process chamber 10, is located above the substrate support pedestal 48. The gas manifold 34 is connected to a gas panel (not shown), which controls and supplies various process gases to the process chamber 10.

Proper control and regulation of the gas flows to the gas manifold 34 are performed by mass flow controllers (not shown) and a microprocessor controller 70. The gas manifold 34 allows process gases to be introduced and uniformly distributed in the process chamber 10. Additionally, the gas manifold 34 may optionally be heated to prevent condensation of any reactive gases within the manifold.

The gas manifold 34 includes a plurality of electronic control valves (not shown). The electronic control valves as used herein refer to any control valve capable of providing rapid and precise gas flow to the process chamber 10 with valve open and close cycles within a range from about 0.01 seconds to about 10 seconds, preferably from about 0.05 seconds to about 2 seconds and more preferably from about 0.1 seconds to about 1 second.

The microprocessor controller 70 may be one of any form of general purpose computer processor (CPU) that can be used in an industrial setting for controlling various chambers and sub-processors. The computer may use any suitable memory, such as random access memory, read only memory, floppy disk drive, compact disc drive, hard disk, or any other form of digital storage, local or remote. Various support circuits may be coupled to the CPU for supporting the processor in a conventional manner. Software routines, as required, may be stored in the memory or executed by a second CPU that is remotely located.

The software routines are executed to initiate process recipes or sequences. The software routines, when executed, transform the general purpose computer into a specific process computer that controls the chamber operation so that a chamber process is performed. For example, software routines may be used to precisely control the activation of the electronic control valves for the execution of process sequences according to the present invention. Alternatively, the software routines may be performed in hardware, as an application specific integrated circuit or other type of hardware implementation, or a combination of software or hardware.

Figure 2:
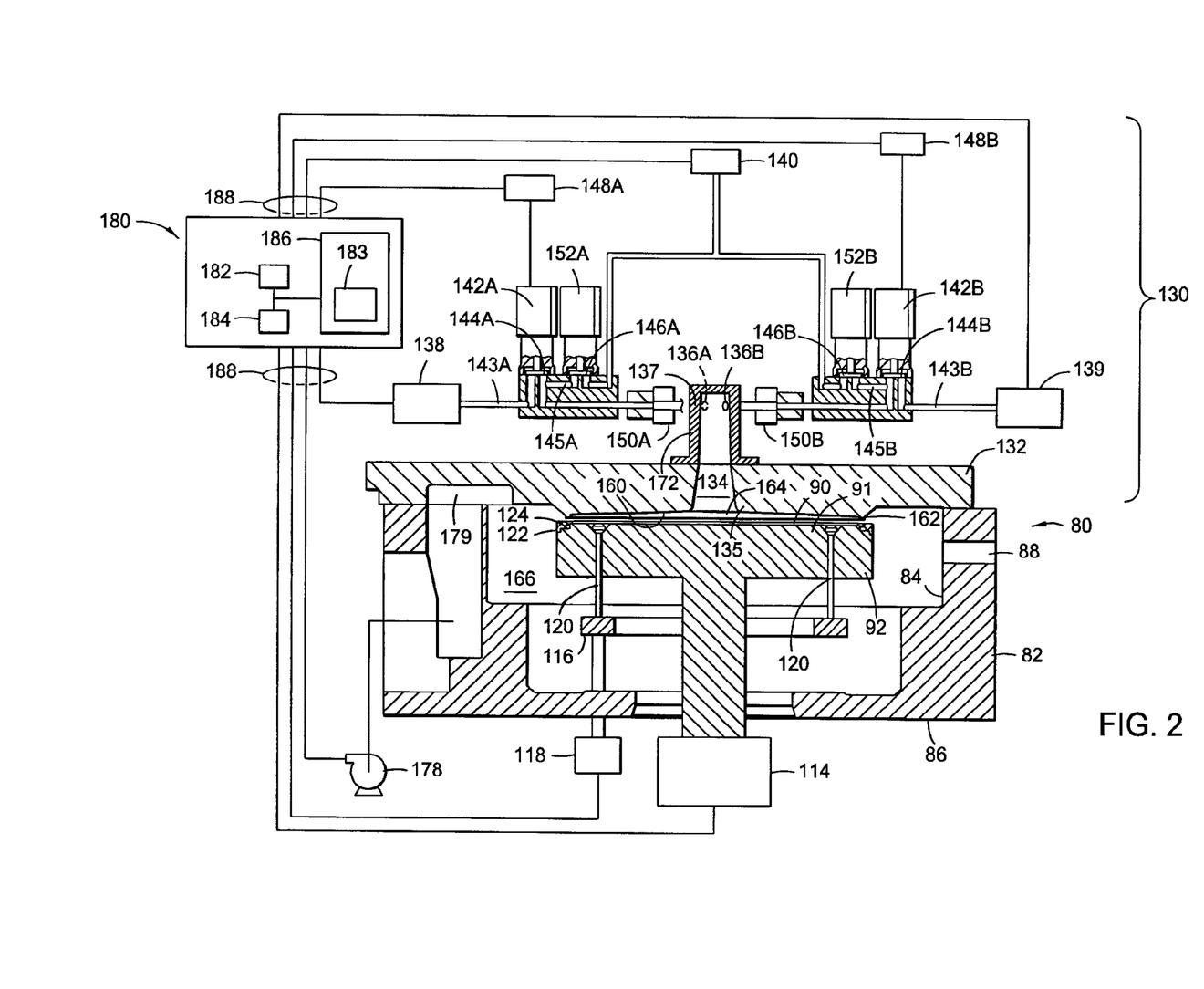
FIG. 2 depicts a schematic cross-sectional view of another process chamber that can be used to perform a cyclical deposition process described herein.

FIG. 2 is a schematic cross-sectional view of one embodiment of a process chamber 80 including a gas delivery apparatus 130 adapted for cyclic deposition, such as atomic layer deposition or rapid chemical vapor deposition. A detailed description for a process chamber 80 is described in commonly assigned United States Publication No. 20030079686, and issued as U.S. Pat. No. 6,916,398, and commonly assigned U.S. Ser. No. 10/281,079, entitled "Gas Delivery Apparatus for Atomic Layer Deposition", filed Oct. 25, 2002, and published as U.S. Pub. No. 2003-0121608, which are both incorporated herein in their entirety by reference. The terms atomic layer deposition (ALD) and rapid chemical vapor deposition as used herein refer to the sequential introduction of reactants to deposit a thin layer over a substrate structure. The sequential introduction of reactants may be repeated to deposit a plurality of thin layers to form a conformal layer to a desired thickness. The process chamber 80 may also be adapted for other deposition techniques.

The process chamber 80 comprises a chamber body 82 having sidewalls 84 and a bottom 86. A slit valve 88 in the process chamber 80 provides access for a robot (not shown) to deliver and retrieve a substrate 90, such as a semiconductor wafer with a diameter of 200 mm or 300 mm or a glass substrate, from the process chamber 80.

A substrate support 92 supports the substrate 90 on a substrate receiving surface 91 in the process chamber 80. The substrate support 92 is mounted to a lift motor 114 to raise and lower the substrate support 92 and a substrate 90 disposed thereon. A lift plate 116 connected to a lift motor 118 is mounted in the process chamber 80 and raises and lowers pins 120 movably disposed through the substrate support 92. The pins 120 raise and lower the substrate 90 over the surface of the substrate support 92. The substrate support 92 may include a vacuum chuck, an electrostatic chuck, or a clamp ring for securing the substrate 90 to the substrate support 92 during processing.

The substrate support 92 may be heated to increase the temperature of a substrate 90 disposed thereon. For example, the substrate support 92 may be heated using an embedded heating element, such as a resistive heater, or may be heated using radiant heat, such as heating lamps disposed above the substrate support 92. A purge ring 122 may be disposed on the substrate support 92 to define a purge channel 124 which provides a purge gas to a peripheral portion of the substrate 90 to prevent deposition thereon.

A gas delivery apparatus 130 is disposed at an upper portion of the chamber body 82 to provide a gas, such as a process gas and/or a purge gas, to the chamber 80. A vacuum system 178 is in communication with a pumping channel 179 to evacuate any desired gases from the process chamber 80 and to help maintain a desired pressure or a desired pressure range inside a pumping zone 166 of the process chamber 80.

In one embodiment, the chambers depicted by FIGS. 1 and 2 permit the process gas and/or purge gas to enter the process chamber 80 normal (i.e., 90°) with respect to the plane of the substrate 90 via the gas delivery apparatus 130. Therefore, the surface of substrate 90 is symmetrically exposed to gases that allow uniform film formation on substrates. The process gas includes a ruthenium-containing precursor (e.g., bis(2,4-dimethylpentadienyl)ruthenium) during one pulse and includes a reducing gas (e.g., oxygen) in another pulse.

Process chamber 80, depicted in FIG. 2, produces a more uniform film than chamber 10, depicted in FIG. 1. Also, process chamber 80 employs a smaller cycle time than chamber 10, since process chamber 80 takes less time to purge and less time to dose the wafer to saturation with precursor than chamber 10. The lesser dosing time is important because many of the ruthenium-containing compounds have the inherent characteristic of a low vapor pressure. The low vapor pressure correlates to less precursor saturating the carrier gas per time and temperature, therefore, more time is needed to saturate the surface of the wafer with ruthenium-containing compound (e.g., bis(2,4-dimethylpentadienyl)ruthenium) than a traditional precursor with a higher vapor pressure (e.g., TiCl$_4$). Therefore, process chambers 10 and 80 may dose a ruthenium-containing compound for about 10 seconds or less, preferably process chamber 80 may dose the ruthenium-containing compound for about 4 seconds or less, preferably for about 1 second or less, and more preferably for about 0.2 seconds or less.

In one embodiment, the gas delivery apparatus 130 comprises a chamber lid 132. The chamber lid 132 includes an expanding channel 134 extending from a central portion of the chamber lid 132 and a bottom surface 160 extending from the expanding channel 134 to a peripheral portion of the chamber lid 132. The bottom surface 160 is sized and shaped to substantially cover a substrate 90 disposed on the substrate support 92. The expanding channel 134 has gas inlets 136A, 136B to provide gas flows from two similar pairs of valves 142A/152A, 142B/152B, which may be provided together and/or separately.

In one configuration, valve 142A and valve 142B are coupled to separate reactant gas sources but are preferably coupled to the same purge gas source. For example, valve 142A is coupled to reactant gas source 138 and valve 142B is coupled to reactant gas source 139, and both valves 142A, 142B are coupled to purge gas source 140. Each valve 142A, 142B includes a delivery line 143A, 143B having a valve seat assembly 144A, 144B and each valves 152A, 152B includes a purge line 145A, 145B having a valve seat assembly 146A, 146B. The delivery line 143A, 143B is in communication with the reactant gas source 138, 139 and is in communication with the gas inlet 136A, 136B of the expanding channel 134. The valve seat assembly 144A, 144B of the delivery line 143A, 143B controls the flow of the reactant gas from the reactant gas source 138, 139 to the expanding channel 134. The purge line 145A, 145B is in communication with the purge gas source 140 and intersects the delivery lines 143A, 143B downstream of the valve seat assembly 144A, 144B of the valves 142A, 142B. The valve seat assembly 146A, 146B of the purge line 145A, 145B controls the flow of the purge gas from the purge gas source 140 to the delivery line 143A, 143B. If a carrier gas is used to deliver reactant gases from the reactant gas source 138, 139, preferably the same gas is used as a carrier gas and a purge gas (La, an argon gas used as a carrier gas and a purge gas).

Each valve seat assembly 144A, 144B, 146A, 146B may comprise a diaphragm and a valve seat. The diaphragm may be biased open or closed and may be actuated closed or open respectively. The diaphragms may be pneumatically actuated or may be electrically actuated. Examples of pneumatically actuated valves include pneumatically actuated valves available from Fujiken and Veriflow. Examples of electrically actuated valves include electrically actuated valves available from Fujiken. Programmable logic controllers 148A, 148B may be coupled to the valves 142A, 142B to control actuation of the diaphragms of the valve seat assemblies 144A, 144B, 146A, 146B of the valves 142A, 142B. Pneumatically actuated valves may provide pulses of gases in time periods as low as about 0.020 seconds. Electrically actuated valves may provide pulses of gases in time periods as low as about 0.005 seconds. An electrically actuated valve typically requires the use of a driver coupled between the valve and the programmable logic controller.

Each valve 142A, 142B may be a zero dead volume valve to enable flushing of a reactant gas from the delivery line 143A, 143B when the valve seat assembly 144A, 144B of the valve is closed. For example, the purge line 145A, 145B may be positioned adjacent the valve seat assembly 144A, 144B of the delivery line 143A, 143B. When the valve seat assembly 144A, 144B is closed, the purge line 145A, 145B may provide a purge gas to flush the delivery line 143A, 143B. In the embodiment shown, the purge line 145A, 145B is positioned slightly spaced from the valve seat assembly 144A, 144B of the delivery line 143A, 143B so that a purge gas is not directly delivered into the valve seat assembly 144A, 144B when open. A zero dead volume valve as used herein is defined as a valve which has negligible dead volume (i.e., not necessary zero dead volume).

Each valve pair 142A/152A, 142B/152B may be adapted to provide a combined gas flow and/or separate gas flows of the reactant gas 138, 139 and the purge gas 140. In reference to valve pair 142A/152A, one example of a combined gas flow of the reactant gas 138 and the purge gas 140 provided by valve 142A comprises a continuous flow of a purge gas from the purge gas source 140 through purge line 145A and pulses of a reactant gas from the reactant gas source 138 through delivery line 143A. The continuous flow of the purge gas may be provided by leaving diaphragm of the valve seat assembly 146A of the purge line 145A open. The pulses of the reactant gas from the reactant gas source 138 may be provided by opening and closing the diaphragm of the valve seat 144A of the delivery line 143A. In reference to valve pair 142A/152A, one example of separate gas flows of the reactant gas 138 and the purge gas 140 provided by valve 142A comprises pulses of a purge gas from the purge gas source 140 through purge line 145A and pulses of a reactant gas from the reactant gas source 138 through delivery line 143A. The pulses of the purge gas may be provided by opening and closing the diaphragm of the valve seat assembly 146A of the purge line 145A open. The pulses of the reactant gas from the reactant gas source 138 may be provided by opening and closing the diaphragm valve seat 144A of the delivery line 143A.

The delivery lines 143A, 143B of the valves 142A, 142B may be coupled to the gas inlets 136A, 136B through gas conduits 150A, 150B. The gas conduits 150A, 150B may be integrated or may be separate from the valves 142A, 142B. In one aspect, the valves 142A, 142B are coupled in close proximity to the expanding channel 134 to reduce any unnecessary volume of the delivery line 143A, 143B and the gas conduits 150A, 150B between the valves 142A, 142B and the gas inlets 136A, 136B.

In FIG. 2, the expanding channel 134 comprises a channel which has an inner diameter which increases from an upper portion 137 of cap 172 to a lower portion 135 of the expanding channel 134 adjacent the bottom surface 160 of the chamber lid 132.

In one specific embodiment, the inner diameter of the expanding channel 134 for a chamber adapted to process 200 mm diameter substrates is between about 0.2 inches (0.51 cm) and about 1.0 inches (2.54 cm), more preferably between about 0.3 inches (0.76 cm) and about 0.9 inches (2.29 cm) and more preferably between about 0.3 inches (0.76 cm) and about 0.5 inches (1.27 cm) at the upper portion 137 of the expanding channel 134 and between about 0.5 inches (1.27 cm) and about 3.0 inches (7.62 cm), preferably between about 0.75 inches (1.91 cm) and about 2.5 inches (6.35 cm) and more preferably between about 1.1 inches (2.79 cm) and about 2.0 inches (5.08 cm) at the lower portion 135 of the expanding channel 134.

In another specific embodiment, the inner diameter of the expanding channel 134 for a chamber adapted to process 300 mm diameter substrates is between about 0.2 inches (0.51 cm) and about 1.0 inches (2.54 cm), more preferably between about 0.3 inches (0.76 cm) and about 0.9 inches (2.29 cm) and more preferably between about 0.3 inches (0.76 cm) and about 0.5 inches (1.27 cm) at the upper portion 137 of the expanding channel 134 and between about 0.5 inches (1.27 cm) and about 3.0 inches (7.62 cm), preferably between about 0.75 inches (1.91 cm) and about 2.5 inches (6.35 cm) and more preferably between about 1.2 inches (3.05 cm) and about 2.2 inches (5.59 cm) at the lower portion 135 of the expanding channel 134 for a 300 mm substrate. In general, the above dimension apply to an expanding channel adapted to provide a total gas flow of between about 500 sccm and about 3,000 sccm.

In other specific embodiments, the dimension may be altered to accommodate a certain gas flow therethrough. In general, a larger gas flow will require a larger diameter expanding channel. In one embodiment, the expanding channel 134 may be shaped as a truncated cone (including shapes resembling a truncated cone). Whether a gas is provided toward the walls of the expanding channel 134 or directly downward towards the substrate, the velocity of the gas flow decreases as the gas flow travels through the expanding channel 134 due to the expansion of the gas. The reduction of the velocity of the gas flow helps reduce the likelihood the gas flow will blow off reactants absorbed on the surface of the substrate 90.

Not wishing to be bound by theory, it is believed that the diameter of the expanding channel 134, which is gradually increasing from the upper portion 137 to the lower portion 135 of the expanding channel, allows less of an adiabatic expansion of a gas through the expanding channel 134 which helps to control the temperature of the gas. For instance, a sudden adiabatic expansion of a gas delivered through the gas inlet 136A, 136B into the expanding channel 134 may result in a drop in the temperature of the gas which may cause condensation of the precursor vapor and formation of particles. On the other hand, a gradually expanding channel 134 according to embodiments of the present invention is believed to provide less of an adiabatic expansion of a gas. Therefore, more heat may be transferred to or from the gas, and, thus, the temperature of the gas may be more easily controlled by controlling the surrounding temperature of the gas (i.e., controlling the temperature of the chamber lid 132). The gradually expanding channel may comprise one or more tapered inner surfaces, such as a tapered straight surface, a concave surface, a convex surface, or combinations thereof or may comprise sections of one or more tapered inner surfaces (i.e., a portion tapered, such as bottom surface 160 and a portion non-tapered, such as choke 162).

In one embodiment, the gas inlets 136A, 136B are located adjacent the upper portion 137 of the expanding channel 134. In other embodiments, one or more gas inlets may be located along the length of the expanding channel 134 between the upper portion 137 and the lower portion 135.

In FIG. 2, a control unit 180, such as a programmed personal computer, work station computer, or the like, may be coupled to the process chamber 80 to control processing conditions. For example, the control unit 180 may be configured to control flow of various process gases and purge gases from gas sources 138, 139, 140 through the valves 142A, 142B during different stages of a substrate process sequence.

Illustratively, the control unit 180 comprises a central processing unit (CPU) 182, support circuitry 184, and memory 186 containing associated control software 183.

The control unit 180 may be one of any form of general purpose computer processor that can be used in an industrial setting for controlling various chambers and sub-processors. The CPU 182 may use any suitable memory 186, such as random access memory, read only memory, floppy disk drive, compact disc drive, hard disk, or any other form of digital storage, local or remote. Various support circuits may be coupled to the CPU 182 for supporting the process chamber 80. The control unit 180 may be coupled to another controller that is located adjacent individual chamber components, such as the programmable logic controllers 148A, 148B of the valves 142A, 142B. Bi-directional communications between the control unit 180 and various other components of the process chamber 80 are handled through numerous signal cables collectively referred to as signal buses 188, some of which are illustrated in FIG. 2. In addition to control of process gases and purge gases from gas sources 138, 139, 140 and from the programmable logic controllers 148A, 148B of the valves 142A, 142B, 152A, 152B, the control unit 180 may be configured to be responsible for automated control of other activities used in wafer processing, such as wafer transport, temperature control, chamber evacuation, among other activities, some of which are described elsewhere herein.

Ruthenium Metal Layer Formation

A method of ruthenium layer formation for high aspect ratio interconnect features is described. The ruthenium layer is deposited using a cyclical deposition process. The cyclical deposition process comprises alternately adsorbing a ruthenium-containing precursor and a reducing gas on a substrate structure. The ruthenium-containing precursor and the reducing gas undergo a reaction to form the ruthenium layer on the substrate. In one embodiment, instead of a ruthenium layer, a noble-metal layer may be deposited as a barrier layer, such as palladium, platinum, cobalt, nickel, rhodium, and combinations thereof. The ruthenium layer may be deposited with a thickness less than 1,000 Å, preferably less than 500 Å and more preferably from about 10 Å to about 100 Å, for example, about 30 Å.

Figure 3:
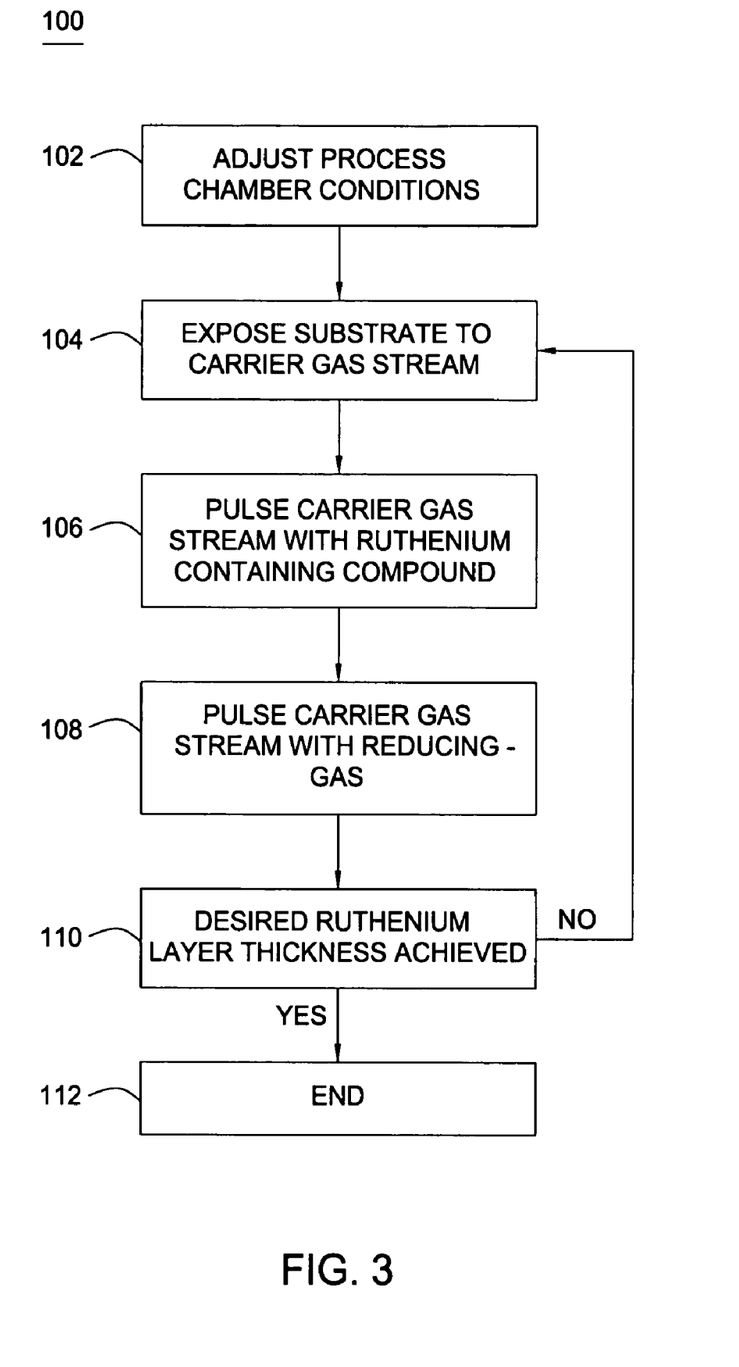
FIG. 3 illustrates a process sequence for ruthenium layer formation using cyclical deposition techniques according to one embodiment described herein.

FIG. 3 illustrates a process sequence 100 detailing the various steps used for the deposition of the ruthenium layer. These steps may be performed in a process chamber similar to that described above with reference to FIGS. 1 and 2. As shown in step 102, a substrate is provided to the process chamber. The substrate may be for example, a silicon substrate having an interconnect pattern defined in one or more dielectric material layers formed thereon. The substrate may contain a barrier layer thereon. The process chamber conditions such as, the temperature and pressure, are adjusted to enhance the adsorption of the process gases on the substrate so as to facilitate the reaction of the ruthenium-containing compounds and the reducing gas.

In general, for ruthenium layer deposition, the substrate should be maintained at a temperature less than about 500° C., preferably in a range from about 200° C. to about 400° C., for example, about 300° C. The process chamber pressure is maintained in a range from about 0.1 Torr to about 80 Torr, preferably from about 1 Torr to about 10 Torr. The ruthenium-containing precursor may be provided at a flow rate between about 0.01 sccm to about 20 sccm, preferably from about 0.1 sccm to about 5 sccm, more preferably between about 0.1 sccm to about 1 sccm. The reducing gas may be provided at a flow rate between about 1 sccm to about 2,000 sccm, preferably between about 20 sccm to about 300 sccm, for example, about 200 sccm.

In one embodiment where a constant carrier gas flow is desired, a carrier gas stream is established within the process chamber as indicated in step 104. Carrier gases may be selected so as to also act as a purge gas for the removal of volatile reactants and/or by-products from the process chamber. Carrier or purge gases such as, for example, helium (He), argon (Ar), nitrogen ($N_2$), hydrogen ($H_2$), or combinations thereof, among others may be used. The pulse of the purge gas lasts for a predetermined time interval, such as within a range from about 0.01 seconds to about 10 seconds, preferably from about 0.07 seconds to about 1 second and more preferably from about 0.1 seconds to about 1 second. The carrier gas and purge gases may be provided at a flow rate between about 500 sccm to about 5,000 sccm, preferably between about 500 sccm to about 2,500 sccm for 200 mm substrates and between about 1,000 sccm to about 5,000 sccm for 300 mm substrates.

Referring to step 106, after the carrier gas stream is established within the process chamber, a pulse of a ruthenium-containing precursor is added to the carrier gas stream. The term pulse as used herein refers to a dose of material injected into the process chamber or into the carrier gas stream. The pulse of the ruthenium-containing precursor lasts for a predetermined time interval, such as within a range from about 0.01 seconds to about 10 seconds, preferably from about 0.05 seconds to about 4 seconds, for example, about 2 seconds.

Generally, in order to use a ruthenocene compound during a Ru-ALD process, a surface treatment step is required, unless the surface is terminated with a hydroxyl group, such as —OH, or an electron-rich surface, such as a metallic layer. On a barrier layer such as tantalum nitride, ruthenocene precursors do not deposit ruthenium layers via ALD processes without a pre-treatment step. Even with a pre-treatment step, such as the hydroxylation of the barrier surface, the randomly placed nucleation sites cause ruthenocene to form satellites or islands of ruthenium during the deposition process. Therefore, the Ru-ALD processes with ruthenocene precursors generally deposit ruthenium layers having an increased electrical resistance, probably due to the unevenness of the ruthenium layer. Also, a high absorption temperature above 400° C. is usually required for ruthenocene precursors. Such a high temperatures may damage device structure within a sensitive low-k dielectric environment, for example, within a copper back end of line (BEOL) process. Hence, it is preferred to perform Ru-ALD processes at a temperature less than 400° C., preferably, less than 350° C. Further, ruthenium layers deposited from ruthenocene precursors used during Ru-ALD on dielectric surfaces tend to fail tape testing due to the low adhesion of the underlying layer. Therefore, in many embodiments, ruthenocene compounds, such as bis(ethylcyclopentadienyl) ruthenium, bis(cyclopentadienyl) ruthenium and bis(pentamethylcyclopentadienyl)ruthenium are less desirable ruthenium precursors. Accordingly, the oxygen-containing reducing gas when combined with organometallic noble metal-containing precursors, especially ruthenium-containing compounds and particularly the preferred ruthenium precursors, provides new advantages in convenience, lower expense, and superior film quality, including improved adhesion, especially to low-K dielectrics, since the reduction of the ionic metal nucleus to form the metallic layer is in part caused by the oxidation of the organic ligands bound to the noble metal-containing precursor.

Embodiments of the present invention include improved methodologies overcoming disadvantages of the prior art, and preferred precursors and chemistries providing additional advantages over the prior art. Ruthenium-containing compounds preferably include ruthenium and at least one open chain dienyl ligand, such as $CH_2CRCHCRCH_2$, where R is independently an alkyl group or hydrogen. Generally, the ruthenium-containing compound has two open-chain dienyl ligands, such as pentadienyl or heptadienyl. A bis(pentadienyl)ruthenium compound has a generic chemical formula ($CH_2CRCHCRCH_2)_2Ru$, where R is independently an alkyl group or hydrogen. Usually, R is independently hydrogen, methyl, ethyl, propyl or butyl. Therefore, ruthenium-containing compounds may include bis(dialkylpentadienyl)ruthenium compounds, bis(alkylpentadienyl)ruthenium compounds, bis(pentadienyl)ruthenium compounds and combinations thereof. Examples of ruthenium-containing compounds include bis(2,4-dimethylpentadienyl)ruthenium, bis(2,4-diethylpentadienyl)ruthenium, bis(2,4-diisopropylpentadienyl)ruthenium, bis(2,4-ditertbutylpentadienyl)ruthenium, bis(methylpentadienyl) ruthenium, bis(ethylpentadienyl) ruthenium, bis(isopropylpentadienyl) ruthenium, bis(tertbutylpentadienyl) ruthenium, derivatives thereof and combinations thereof. In some embodiments, other ruthenium-containing compounds include tris(2,2,6,6-tetramethyl-3,5-heptanedionato)ruthenium, dicarbonyl pentadienyl ruthenium, ruthenium acetyl acetonate, (2,4-dimethylpentadienyl)ruthenium(cyclopentadienyl), bis(2,2,6,6-tetramethyl-3,5-heptanedionato)ruthenium(1,5-cyclooctadiene), (2,4-dimethylpentadienyl)ruthenium(methylcyclopentadienyl), (1,5-cyclooctadiene)ruthenium(cyclopentadienyl), (1,5-cyclooctadiene)ruthenium(methylcyclopentadienyl), (1,5-cyclooctadiene)ruthenium(ethylcyclopentadienyl), (2,4-dimethylpentadienyl)ruthenium(ethylcyclopentadienyl), (2,4-dimethylpentadienyl)ruthenium(isopropylcyclopentadienyl), bis(N, N-dimethyl 1,3-tetramethyl diiminato) ruthenium(1,5-cyclooctadiene), bis(N,N-dimethyl 1,3-dimethyl diiminato)ruthenium(1,5-cyclooctadiene), bis(allyl)ruthenium(1,5-cyclooctadiene), ($\eta^6$-$C_6H_6$)ruthenium (1,3-cyclohexadiene), bis(1,1-dimethyl-2-aminoethoxylato) ruthenium(1,5-cyclooctadiene), bis(1,1-dimethyl-2-aminoethylaminato)ruthenium(1,5-cyclooctadiene), derivatives thereof and combinations thereof.

Other noble metal-containing compounds may be used as a substitute for ruthenium-containing compounds to deposit their respective noble metal layer, such as precursors containing palladium, platinum, cobalt, nickel and rhodium. Palladium-containing precursors, for example, bis(allyl)palladium, bis(2-methylallyl)palladium, and (cyclopentadienyl) (allyl)palladium, derivatives thereof and combinations thereof. Suitable platinum-containing precursors include dimethyl(cyclooctadiene)platinum, trimethyl(cyclopentadienyl)platinum, trimethyl(methylcyclopentadienyl)platinum, cyclopentadienyl(allyl)platinum, methyl(carbonyl)cyclopentadienylplatinum, trimethyl(acetylacetonato)platinum, bis(acetylacetonato)platinum, derivatives thereof and combinations thereof. Suitable cobalt-containing precursors include bis(cyclopentadienyl)cobalt, (cyclopentadienyl)(cyclohexadienyl)cobalt, cyclopentadienyl(1,3-hexadienyl)cobalt, (cyclobutadienyl)(cyclopentadienyl)cobalt, bis(methylcyclopentadienyl)cobalt, (cyclopentadienyl)(5-methylcyclopentadienyl)cobalt, bis(ethylene) (pentamethylcyclopentadienyl)cobalt, derivatives thereof and combinations thereof. A suitable nickel-containing precursor includes bis(methylcyclopentadienyl) nickel and suitable rhodium-containing precursors include bis(carbonyl) (cyclopentadienyl)rhodium, bis(carbonyl) (ethylcyclopentadienyl)rhodium, bis(carbonyl) (methylcyclopentadienyl)rhodium, bis(propylene)rhodium, derivatives thereof and combinations thereof.

The time interval for the pulse of the ruthenium-containing compound is variable depending upon a number of factors such as, for example, the volume capacity of the process chamber employed, the vacuum system coupled thereto and the volatility/reactivity of the reactants used. For example, (1) a large-volume process chamber may lead to a longer time to stabilize the process conditions such as, for example, carrier/purge gas flow and temperature, requiring a longer pulse time; (2) a lower flow rate for the process gas may also lead to a longer time to stabilize the process conditions requiring a longer pulse time; and (3) a lower chamber pressure means that the process gas is evacuated from the process chamber more quickly requiring a longer pulse time. In general, the process conditions are advantageously selected so that a pulse of the ruthenium-containing compound provides a sufficient amount of precursor so that at least a monolayer of the ruthenium-containing compound is adsorbed on the substrate. Thereafter, excess ruthenium-containing compound remaining in the chamber may be removed from the process chamber by the constant carrier gas stream in combination with the vacuum system.

In step 108, after the excess ruthenium-containing compound has been flushed from the process chamber by the carrier gas stream, a pulse of a reducing gas or reductant is added to the carrier gas stream. A reducing gas may include a reductant and another gas, such as a carrier gas. The pulse of the reducing gas also lasts for a predetermined time interval. In general, the time interval for the pulse of the reducing gas should be long enough for adsorption of at least a monolayer of the reducing gas on the ruthenium-containing compound. The pulse of reducing gas lasts for a predetermined time interval, such as within a range from about 0.01 seconds to about 10 seconds, preferably from about 0.1 seconds to about 2 seconds and more preferably from about 0.1 seconds to about 1 second. Thereafter, excess reducing gas is flushed from the process chamber by the carrier gas stream.

Suitable reducing gases may include traditional reductants, for example, hydrogen (e.g., $H_2$ or atomic-H), ammonia ($NH_3$), silane ($SiH_4$), disilane ($Si_2H_6$), trisilane ($Si_3H_8$), tetrasilane ($Si_4H_{10}$), dimethylsilane ($SiC_2H_8$), methyl silane ($SiCH_6$), ethylsilane ($SiC_2H_8$), chlorosilane ($ClSiH_3$), dichlorosilane ($Cl_2SiH_2$), hexachlorodisilane ($Si_2Cl_6$), borane ($BH_3$), diborane ($B_2H_6$), triborane, tetraborane, pentaborane, triethylborane ($Et_3B$), derivatives thereof and combinations thereof.

Preferably, the reducing gas may include oxygen-containing gases used as a reductant, such as oxygen (e.g., $O_2$), nitrous oxide ($N_2O$), nitric oxide (NO), nitrogen dioxide ($NO_2$), derivatives thereof and combinations thereof. Furthermore, the traditional reductants may be combined with the oxygen-containing reductants to form a reducing gas. Oxygen-containing gases that are used in embodiments of the present invention are traditionally used in the chemical art as an oxidant. However, ligands on an organometallic compound containing a noble metal (e.g., Ru) are usually more susceptible to the oxygen-containing reductants than the noble metal. Therefore, the ligand is generally oxidized from the metal center while the metal ion is reduced to form the elemental metal. In one embodiment, the reducing gas is air containing ambient oxygen as the reductant. The air may be dried over sieves to reduce ambient water.

Oxygen-containing gases utilized as reductants during ALD processes provide many advantages over the use of traditional reductants. The adhesion from a ruthenium film deposited by oxygen-containing gas reduction, especially deposited to low-k materials, is stronger than the adhesion from a ruthenium film deposited by a traditional reductant as evident by the tape test. Ruthenium films deposited by oxygen-containing gas reductants adhered to the substrate surface during removal of the tape while ruthenium films deposited by a traditional reductant are peeled from the substrate surface upon removing the tape. Also, the electrical conductivity from ruthenium films reduced by oxygen-containing gases is higher than that by traditional reductants. The higher electrical conductivity may, in part, be due to the oxidation and subsequent removal of carbon.

Steps 104 through 108 comprise one embodiment of a deposition cycle for a ruthenium layer. For such an embodiment, a constant flow of carrier gas is provided to the process chamber modulated by alternating periods of pulsing and non-pulsing where the periods of pulsing alternate between the ruthenium-containing compound and the reducing gas along with the carrier gas stream, while the periods of non-pulsing include only the carrier gas stream.

The time interval for each of the pulses of the ruthenium-containing compound and the reducing gas may have the same duration. That is, the duration of the pulse of the ruthenium-containing compound may be identical to the duration of the pulse of the reducing gas. For such an embodiment, a time interval ($T_1$) for the pulse of the ruthenium-containing compound is equal to a time interval ($T_2$) for the pulse of the reducing gas.

Alternatively, the time interval for each of the pulses of the ruthenium-containing compound and the reducing gas may have different durations. That is, the duration of the pulse of the ruthenium-containing compound may be shorter or longer than the duration of the pulse of the reducing gas. For such an embodiment, a time interval ($T_1$) for the pulse of the ruthenium-containing compound is different than the time interval ($T_2$) for the pulse of the reducing gas.

In addition, the periods of non-pulsing between each of the pulses of the ruthenium-containing compound and the reducing gas may have the same duration. That is, the duration of the period of non-pulsing between each pulse of the ruthenium-containing compound and each pulse of the reducing gas is identical. For such an embodiment, a time interval ($T_3$) of non-pulsing between the pulse of the ruthenium-containing compound and the pulse of the reducing gas is equal to a time interval ($T_4$) of non-pulsing between the pulse of the reducing gas and the pulse of the ruthenium-containing compound. During the time periods of non-pulsing only the constant carrier gas stream is provided to the process chamber.

Alternatively, the periods of non-pulsing between each of the pulses of the ruthenium-containing compound and the reducing gas may have different duration. That is, the duration of the period of non-pulsing between each pulse of the ruthenium-containing compound and each pulse of the reducing gas may be shorter or longer than the duration of the period of non-pulsing between each pulse of the reducing gas and the ruthenium-containing compound. For such an embodiment, a time interval ($T_3$) of non-pulsing between the pulse of the ruthenium-containing compound and the pulse of the reducing gas is different from a time interval ($T_4$) of non-pulsing between the pulse of the reducing gas and the pulse of ruthenium-containing compound. During the time periods of non-pulsing only the constant carrier gas stream is provided to the process chamber.

Additionally, the time intervals for each pulse of the ruthenium-containing compound, the reducing gas and the periods of non-pulsing therebetween for each deposition cycle may have the same duration. For such an embodiment, a time interval ($T_1$) for the ruthenium-containing compound, a time interval ($T_2$) for the reducing gas, a time interval ($T_3$) of non-pulsing between the pulse of the ruthenium-containing compound and the pulse of the reducing gas and a time interval ($T_4$) of non-pulsing between the pulse of the reducing gas and the pulse of the ruthenium-containing compound each have the same value for each deposition cycle. For example, in a first deposition cycle ($C_1$), a time interval ($T_1$) for the pulse of the ruthenium-containing compound has the same duration as the time interval ($T_1$) for the pulse of the ruthenium-containing compound in subsequent deposition cycles ($C_2 \ldots C_n$). Similarly, the duration of each pulse of the reducing gas and the periods of non-pulsing between the pulse of the ruthenium-containing compound and the reducing gas in the first deposition cycle ($C_1$) is the same as the duration of each pulse of the reducing gas and the periods of non-pulsing between the pulse of the ruthenium-containing compound and the reducing gas in subsequent deposition cycles ($C_2 \ldots C_n$), respectively.

Alternatively, the time intervals for at least one pulse of the ruthenium-containing compound, the reducing gas and the periods of non-pulsing therebetween for one or more of the deposition cycles of the ruthenium layer deposition process may have different durations. For such an embodiment, one or more of the time intervals ($T_1$) for the pulses of the ruthenium-containing compound, the time intervals ($T_2$) for the pulses of the reducing gas, the time intervals ($T_3$) of non-pulsing between the pulse of the ruthenium-containing compound and the reducing gas and the time intervals ($T_4$) of non-pulsing between the pulses of the reducing gas and the ruthenium-containing compound may have different values for one or more deposition cycles of the cyclical deposition process. For example, in a first deposition cycle ($C_1$), the time interval ($T_1$) for the pulse of the ruthenium-containing compound may be longer or shorter than one or more time interval ($T_1$) for the pulse of the ruthenium-containing compound in subsequent deposition cycles ($C_2 \ldots C_n$). Similarly, the durations of the pulses of the reducing gas and the periods of non-pulsing between the pulse of the ruthenium-containing compound and the reducing gas in the first deposition cycle ($C_1$) may be the same or different than the duration of each pulse of the reducing gas and the periods of non-pulsing between the pulse of the ruthenium-containing compound and the reducing gas in subsequent deposition cycles ($C_2 \ldots C_n$).

Referring to step 110, after each deposition cycle (steps 104 through 108) a thickness of the ruthenium layer will be formed on the substrate. Depending on specific device requirements, subsequent deposition cycles may be needed to achieve a desired thickness. As such, steps 104 through 108 are repeated until the desired thickness for the ruthenium layer is achieved. Thereafter, when the desired thickness for the ruthenium layer is achieved the process is stopped as indicated by step 112.

Figure 4:
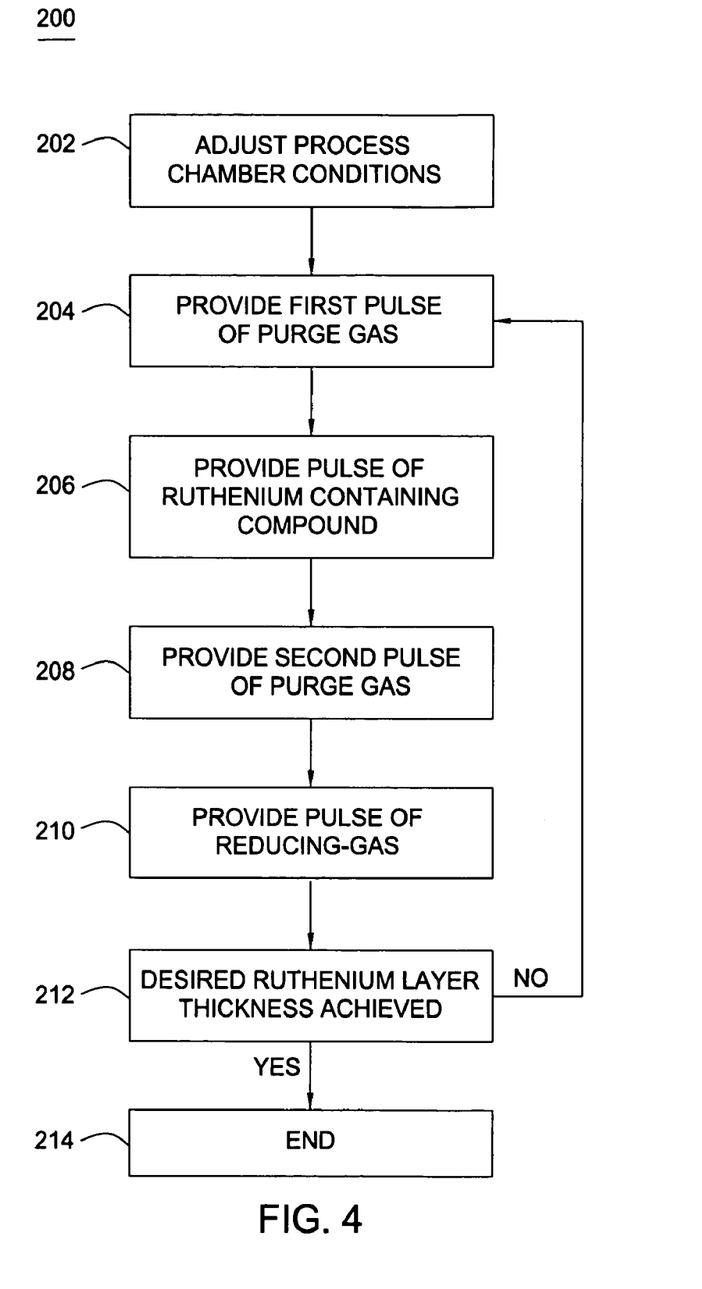
FIG. 4 illustrates a process sequence for ruthenium layer formation using cyclical deposition techniques according to an alternate embodiment described herein.

In an alternate process sequence described with respect to FIG. 4, the ruthenium layer deposition cycle comprises separate pulses for each of the ruthenium-containing compound, the reducing gas and a purge gas. For such an embodiment, the ruthenium layer deposition sequence 200 includes providing a substrate to the process chamber (step 202), providing a first pulse of a purge gas to the process chamber (step 204), providing a pulse of a ruthenium-containing compound to the process chamber (step 206), providing a second pulse of the purge gas to the process chamber (step 208), providing a pulse of a reducing gas to the process chamber (step 210), and then repeating steps 204 through 210, or stopping the deposition process (step 214) depending on whether a desired thickness for the ruthenium layer has been achieved (step 212).

The time intervals for each of the pulses of the ruthenium-containing compound, the reducing gas and the purge gas may have the same or different durations as discussed above with respect to FIG. 3. Alternatively, corresponding time intervals for one or more pulses of the ruthenium-containing compound, the reducing gas and the purge gas in one or more of the deposition cycles of the ruthenium layer deposition process may have different durations.

In FIGS. 3-4, the ruthenium layer deposition cycle is depicted as beginning with a pulse of the ruthenium-containing compound followed by a pulse of the reducing gas. Alternatively, the ruthenium layer deposition cycle may start with a pulse of the reducing gas followed by a pulse of the ruthenium-containing compound. In either embodiment of the ALD processes described in FIGS. 3-4, the preferred ruthenium-containing compound is bis(2,4-dimethylpentadienyl) ruthenium (($DMPD)_2Ru$) and the preferred reducing gas contains oxygen ($O_2$).

One exemplary process of depositing a ruthenium layer by an ALD process to a substrate (e.g., 300 mm), in the process chamber 80 of FIG. 2, comprises providing pulses of a ruthenium-containing compound, such as $(DMPD)_2Ru$, from gas source 138 at a flow rate between about 0.01 sccm and about 5 sccm, preferably between about 0.1 sccm and about 1 sccm, through valve 142A for a pulse time of about 4 seconds or less, preferably about 1.5 seconds or less, such as about 0.1 seconds or less, and as low as about 0.05 seconds or less due the smaller volume of the reaction zone 164 (as compared to chamber 8 of FIG. 1). Pulses of a reducing gas, such as oxygen ($O_2$), may be provided from gas source 139 at a flow rate between about 1 sccm and about 1,000 sccm, preferably between 10 sccm and about 500 sccm, more preferably from about 100 sccm to about 300 sccm through valve 142B for a pulse time of about 2 seconds or less, about 1 second or less, or about 0.1 seconds or less due to a smaller volume of the reaction zone 164. An argon purge gas at a flow rate between about 500 sccm and about 5,000 sccm, preferably, between about 1,500 sccm and about 3,500 sccm, may be continuously provided or pulsed from gas source 140 through valves 142A, 142B. The time between pulses of $(DMPD)_2Ru$ and $O_2$ may be about 0.5 seconds or less, such as about 0.1 seconds or less, and as low as about 0.07 seconds or less due to the smaller volume of the reaction zone 164. It is believed to fill a reaction zone with a reactant gas and/or purge gas, pulse times as low as about 0.016 seconds are sufficient, with correspondingly shorter pulse times for a reaction zone 164 sized for smaller wafers (e.g., 200 mm). The heater temperature is maintained from about 100° C. to about 600° C., preferably from about 200° C. to about 400° C., for example, about 350° C. The chamber pressure is maintained from about 0.1 Torr to about 20 Torr, preferably from about 1.0 Torr to about 10 Torr, for example, at about 1.5 Torr. This process provides a ruthenium layer with a thickness from about 0.1 Å to about 1.0 Å per ALD cycle. The alternating sequence may be repeated until a desired thickness is achieved.

The ruthenium layer is deposited to a sidewall coverage with a thickness of about 1,000 Å or less, generally from about 1 Å to about 500 Å. In some aspects, the ruthenium layer is deposited to a sidewall coverage with a thickness of about 50 Å or less, preferably about 20 Å or less. In still another embodiment, the ruthenium layer is deposited to a sidewall coverage of about 10 Å or less. A ruthenium layer with a thickness of about 10 Å or less is believed to be a sufficient thickness in the application as an underlayer to adhere copper deposition (i.e., seed layer) and prevent copper diffusion (i.e., barrier layer). In one aspect, a thin ruthenium underlayer may be used to advantage in filling sub-micron (e.g., less than 0.15 µm) and smaller features having high aspect ratios (e.g., greater than 5 to 1). In one embodiment, ruthenium is deposited as a seed layer. In another embodiment, ruthenium is deposited as a barrier layer. In another embodiment, ruthenium is deposited as a top and/or bottom contact of an electrode.

Embodiments of the present invention include improved methodologies overcoming disadvantages of the prior art, and preferred precursors and chemistries providing additional advantages, such as higher conductance for deposited ruthenium layers. Ruthenium-containing compounds containing at least one open chain dienyl ligand, such as $CH_2CRCHCRCH_2$, form ruthenium layer with a sheet resistance less than 2,000 Ω/sq, preferably less than 1,000 Ω/sq, and more preferably less than 500 Ω/sq. For example, ALD processes conducted at a temperature within the range from about 300° C. to about 350° C. form ruthenium layers with a sheet resistance measuring from about 25 Ω/sq to about 250 Ω/sq. In another example, a ruthenium layer with a thickness of about 100 Å may have a resistivity less than 15 μΩ-cm.

Formation of Copper Interconnects

Figure 5A:
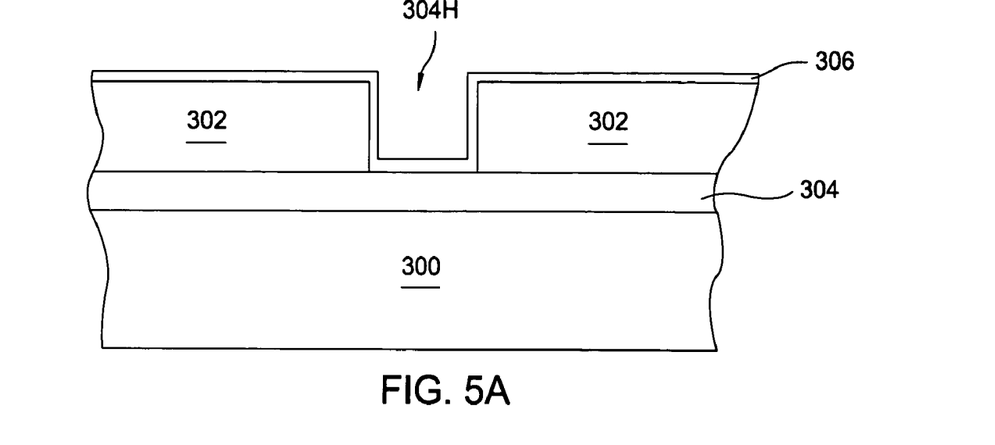
FIGS. 5A-5C illustrate schematic cross-sectional views of an integrated circuit fabrication sequence.
Figure 5B:
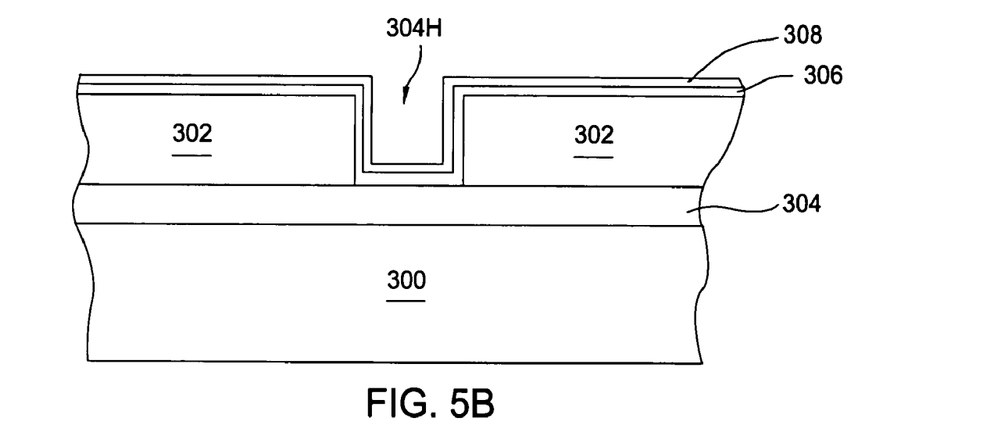
Figure 5C:
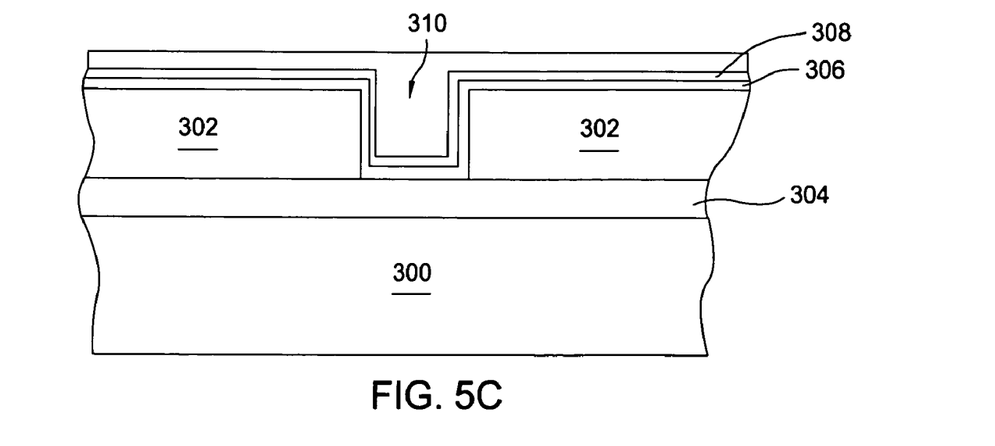

FIGS. 5A-5C illustrate cross-sectional views of a substrate at different stages of a copper interconnect fabrication sequence incorporating the ruthenium layer of the present invention. FIG. 5A, for example, illustrates a cross-sectional view of a substrate 300 having metal contacts 304 and a dielectric layer 302 formed thereon. The substrate 300 may comprise a semiconductor material such as, for example, silicon, germanium, or gallium arsenide. The dielectric layer 302 may comprise an insulating material such as, silicon dioxide, silicon nitride, silicon oxynitride and/or carbon-doped silicon oxides, such as $SiO_xC_y$, for example, BLACK DIAMOND™ low-k dielectric, available from Applied Materials, Inc., located in Santa Clara, Calif. The metal contacts 304 may comprise for example, copper, among others. Apertures 304H may be defined in the dielectric layer 302 to provide openings over the metal contacts 304. The apertures 304H may be defined in the dielectric layer 302 using conventional lithography and etching techniques.

A barrier layer 306 may be formed in the apertures 304H defined in the dielectric layer 302. The barrier layer 306 may include one or more refractory metal-containing layers used as a copper-barrier material such as, for example, titanium, titanium nitride, titanium silicon nitride tantalum, tantalum nitride, tantalum silicon nitride, tungsten and tungsten nitride, among others. The barrier layer 306 may be formed using a suitable deposition process, such as ALD, chemical vapor deposition (CVD) or physical vapor deposition (PVD). For example, titanium nitride may be deposited using a CVD process or an ALD process wherein titanium tetrachloride and ammonia are reacted. In one embodiment, tantalum and/or tantalum nitride is deposited as a barrier layer by an ALD process as described in commonly assigned U.S. Patent Publication 20030121608, filed Oct. 25, 2002, and is herein incorporated by reference.

Referring to FIG. 5B, a ruthenium layer 308 is formed on the barrier layer 306. The ruthenium layer 308 is formed using the cyclical deposition techniques, such as Ru-ALD described above with reference to FIGS. 3-4. The thickness for the ruthenium layer 308 is variable depending on the device structure to be fabricated. Typically, the thickness for ruthenium layer 308 is less than about 1,000 Å, preferably between about 10 Å to about 500 Å. In one embodiment, a ruthenium layer 308 has a thickness less than 100 Å, for example, about 50 Å.

Thereafter, referring to FIG. 5C, the apertures 304H may be filled with copper 310 to complete the copper interconnect. The copper 310 may be formed using one or more suitable deposition processes. In one embodiment, for example, a copper seed layer may be formed on the ruthenium layer by using a CVD process followed by deposition of bulk copper to fill the interconnects using an electrochemical plating (ECP) process. In another embodiment, a copper seed layer is deposited to the ruthenium layer via a PVD process, thereafter an electrochemical copper plating process is utilized to deposit a copper bulk fill. In another embodiment, the ruthenium layer serves as a seed layer to which a copper bulk fill is directly deposited with ECP or electroless copper plating.

Several integration sequence are conducted in order to form a ruthenium layer within the interconnect. In one embodiment, the subsequent steps follow: a) pre-clean of the substrate; b) deposition of a barrier layer (e.g., ALD of TaN); c) deposition of ruthenium by ALD; and d) deposition of copper by ECP or Cu-PVD followed by ECP. In another embodiment, the subsequent steps follow: a) deposition of a barrier layer (e.g., ALD of TaN); b) punch thru step; c) deposition of ruthenium by ALD; and d) deposition of copper by ECP or Cu-PVD followed by ECP. In another embodiment, the subsequent steps follow: a) deposition of ruthenium by ALD; b) punch thru step; c) deposition of ruthenium by ALD; and d) deposition of copper by ECP or Cu-PVD followed by ECP or Cu-PVD followed by ECP. In another embodiment, the subsequent steps follow: a) deposition of ruthenium by ALD; b) punch thru step; c) deposition of ruthenium by ALD; and d) deposition of copper by ECP. In another embodiment, the subsequent steps follow: a) pre-clean of the substrate; b) deposition of ruthenium by ALD; and c) deposition of copper by ECP or Cu-PVD followed by ECP. In another embodiment, the subsequent steps follow: a) deposition of a barrier layer (e.g., ALD of TaN); b) deposition of ruthenium by ALD; c) punch thru step; d) deposition of ruthenium by ALD; and e) deposition of copper by ECP or Cu-PVD followed by ECP.

The pre-clean steps include methods to clean or purify the via, such as the removal of residue at the bottom of the via (e.g., carbon) or reduction of copper oxide to copper metal. Punch thru steps include a method to remove material (e.g., barrier layer) from the bottom of the via to expose conductive layer, such as copper. Further disclosure of punch thru steps are described in more detail in the commonly assigned, U.S. Pat. No. 6,498,091, and is incorporated herein in its entirety by reference. The punch thru steps are conducted in a process chamber, such as either a barrier chamber or a clean chamber. In embodiments of the invention, clean steps and punch thru steps are applied to ruthenium barrier layers. Further disclosure of overall integrated methods are described in more detail in the commonly assigned, U.S. Provisional Patent Application Ser. No. 60/478,663, entitled "Integration of ALD Tantalum Nitride for Copper Metallization", filed Jun. 13, 2003, and is herein incorporated by reference.

Ruthenium Deposition on Dielectric Materials

In another embodiment, a ruthenium layer is deposited by an ALD process on a dielectric material, such as a low-k material. Temperatures above 400° C. may damage device structures, such as within a sensitive, low-k dielectric environment, for example, within a BEOL process. Therefore, it is preferred to perform degassing processes as well as Ru-ALD processes at temperatures less than 400° C. Low-k dielectric materials include carbon-doped silicon oxides, such as $SiO_xC_y$, for example, BLACK DIAMOND™ low-k dielectric, available from Applied Materials, Inc., located in Santa Clara, Calif., or other materials, such as SILK™ or CORAL™. Also, low-k dielectric material may include aerogels, such as ELK™, available from Schumaker, Inc. Other dielectric materials include silicon dioxide, silicon nitride, silicon oxynitride and high-k materials used in metal gate application, such as aluminum oxide ($Al_2O_3$), hafnium oxide (HfO$_2$), hafnium silicate (HfSiO$_4$), tantalum oxide (Ta$_2$O$_5$), zirconium oxide (ZrO$_2$), zirconium silicate (ZrSiO$_4$) and combinations thereof.

A substrate containing a dielectric material is initially exposed to a degassing process for 5 minutes or less, for example, for about 1 minute, while maintaining the substrate at a temperature in a range from about 250° C. to about 400° C., for example, about 350° C. The degassing process may further include maintaining the substrate in a reduced vacuum at a pressure in the range from about $1 \times 10^{-7}$ Torr to about $1 \times 10^{-5}$ Torr, for example, about $5 \times 10^{-6}$ Torr. The degassing process removes volatile surface contaminates, such as water vapor, solvents or volatile organic compounds.

The ruthenium layer is formed using an ALD process described above with reference to FIGS. 3-4. Generally, a single cycle of the Ru-ALD process includes exposing the dielectric material to a ruthenium-containing compound, purging the process chamber, exposing the substrate to an oxygen-containing reducing gas and purging the process chamber. The ALD cycle is repeated until the ruthenium layer has a desired thickness. The thickness for the ruthenium layer is variable depending on the device structure to be fabricated. Typically, the thickness for ruthenium layer 308 is less than about 1,000 Å, preferably at a thickness in a range from about 10 Å to about 500 Å. In one embodiment, a ruthenium layer 308 has a thickness less than 100 Å, for example, about 50 Å.

The Ru-ALD process is conducted at a temperature in a range from about 200° C. to about 400° C., preferably about 350° C. This relatively low deposition temperature is highly advantageous since as mentioned previously, the risk of device damage, particularly where low-k materials are employed, rises significantly as temperatures are above about 400° C. Yet, such higher temperatures are typically required with prior art precursors in order to obtain adsorption on substrates so as to perform deposition via a Ru-ALD process.

The ruthenium-containing precursors and deposition chemistries utilized in various embodiments provide further significant advantages. The layers formed by the present ruthenium methodologies and precursors, such as open chain dienyl ruthenium-containing compounds, have high nucleation density and uniformity. This is believed to promote freedom from surface defects such as satellites or islands in the resulting ruthenium layer, in contrast to layers deposited by prior art methods and where prior methods employ ruthenocene compounds.

Also, the open chain dienyl ruthenium compounds and the oxygen-containing reductants are utilized in various embodiments during the ALD processes to deposit ruthenium films on barriers layers, especially on tantalum nitride. Unlike other Ru-ALD processes that use ruthenocene and/or traditional reductants, the present ruthenium methodologies and precursors are not limited with the need to pretreat the barrier layer prior to the deposition of a ruthenium film. Excess process steps, such as pretreatment steps, are avoided by applying the open chain dienyl ruthenium compounds and the oxygen-containing reductants to reduce the overall throughput of the production line.

Further, ruthenium layers deposited with the present methodologies and especially when employing open chain dienyl ruthenium compounds have superior adhesion properties to barrier layers as well as dielectric materials. It is believe the superior adhesion at least in part is due to the higher degree of uniformity and nucleation density, whereby a more level surface and fewer surface defects results. Furthermore, ruthenocene compounds generally require a temperature above 400° C. in order to become adsorbed to a substrate surface needed during an ALD process. However, since the threshold of many low-k devices is around 400° C., ruthenocene compounds are not desirable ruthenium precursors for ALD processes.

Experiments

Experimental Section 1—Ruthenium on a Barrier Layer

Experiments in this section were conducted on substrates initially prepared by thermally growing a silicon dioxide layer with a thickness of 3,000 Å. Subsequently, a tantalum nitride layer was deposited by an ALD process with a thickness of 10 Å. A full description of the deposition techniques are further discussed in U.S. Patent Publication 20030121608, and is incorporated herein in its entirety by reference. The tantalum nitride film is a dielectric with a sheet resistance greater than 20,000 Ω/sq.

The Ru-ALD experiments were completed in an ALD chamber, as depicted in FIG. 2, available from Applied Materials, Inc., Santa Clara, Calif. Precursor A, a ruthenium-containing compound, is bis(2,4-dimethylpentadienyl)ruthenium ((CH$_2$CH(CH$_3$)CHCH(CH$_3$)CH$_2$)$_2$Ru) and Precursor B, a ruthenocene compound, is bis(ethylcyclopentadienyl)ruthenium ((EtCp)$_2$Ru), as listed in Table 1. During the precursor transfer, the chamber pressure was maintained at less than $5 \times 10^{-6}$ Torr. The chamber spacing (distance between the wafer and the top of chamber body) was 230 mils. An ALD cycle included the following steps. Argon carrier gas containing either Precursor A or Precursor B was exposed to the substrate for 4 seconds at a flow rate of 100 sccm. The chamber was purged with argon for 0.5 seconds at a flow rate of 2,000 sccm and then the substrate was exposed to oxygen (O$_2$) for 1 second at a flow rate of 200 sccm. For the final step in the cycle, the chamber was purged with argon for 0.5 seconds at a flow rate of 2,000 sccm. The ALD process was yielded after the repetition of 100 cycles.

The ruthenium films were measured for sheet resistance (Rs) by using a four-point probe, such as the RS-75 system by KLA-Tencor, located in San Jose, Calif. The RS-75 system was unable to measure sheet resistance greater than 20,000 Ω/sq and therefore identifies that there was no conductive film on the substrate.

TABLE 1

| Temperature ° C. | Precursor A Rs measurement Ω/sq | Precursor B Rs measurement Ω/sq |
|---|---|---|
| 275 | 1,144.6 | No Data |
| 300 | 109.7 | >20,000 |
| 325 | 75.26 | No Data |
| 350 | 56.25 | >20,000 |
| 400 | No Data | >20,000 |

The ALD processes were conducted at a variety of temperatures. At a temperature as low as 275° C., Precursor A was used to form a ruthenium film with good conductivity. Further, deposition conducted from 300° C. to 350° C. greatly improved the conductivity of the ruthenium film, whereas the sheet resistance measured from about 110 Ω/sq to about 56 Ω/sq. However, following the same ALD processes with the exception of substituting Precursor B for Precursor A, ruthenium films could not be deposited.

Experimental Section 2—Ruthenium on a Low-k Layer

Experiments in this section were conducted on substrates initially prepared by thermally growing a silicon dioxide layer with a thickness of 3,000 Å. The substrate was degassed for about 1 minute under a reduced pressure of $5 \times 10^{-6}$ Torr at 350° C. to remove volatile surface contaminates. The Ru-ALD experiments were completed in an ALD chamber, as depicted in FIG. 2, available from Applied Materials, Inc., Santa Clara, Calif. Precursor A, a ruthenium-containing compound, is bis(2,4-dimethylpentadienyl)ruthenium ((CH$_2$CH(CH$_3$)CHCH(CH$_3$)CH$_2$)$_2$Ru) and Precursor B, a ruthenocene compound, is bis(ethylcyclopentadienyl)ruthenium ((EtCp)$_2$Ru) during this section of the experiment. During the precursor transfer, the chamber pressure was maintained at less than 5×10$^{-6}$ Torr and the substrate was maintained at 350° C. The chamber spacing (distance between the wafer and the top of chamber body) was 230 mils.

An ALD cycle included the following steps. Argon carrier gas containing either Precursor A or Precursor B was exposed to the substrate for 4 seconds at a flow rate of 100 sccm. The chamber was purged with argon for 0.5 seconds at a flow rate of 2,000 sccm and then the substrate was exposed to oxygen (O$_2$) for 1 second at a flow rate of 200 sccm. For the final step in the cycle, the chamber was purged with argon for 0.5 seconds at a flow rate of 2,000 sccm. The ALD process was yielded after the repetition of 120 cycles.

The ruthenium films were measured for adhesion by using a tape test. Transparent tape was adhered to both ruthenium films and subsequently removed. The ruthenium layer deposited from the Precursor A stayed on the substrate surface, while the ruthenium layer deposited from the Precursor B peeled from the substrate surface. Therefore, Precursor A has stronger adhesion properties than Precursor B.

While foregoing is directed to the preferred embodiment of the present invention, other and further embodiments of the invention may be devised without departing from the basic scope thereof, and the scope thereof is determined by the claims that follow.

The invention claimed is:

1. A method for forming a ruthenium material on a substrate surface, comprising:
positioning a substrate within a process chamber;
exposing a ruthenium-containing compound to the substrate while forming a ruthenium-containing compound film thereon, wherein the ruthenium-containing compound is selected from the group consisting of bis(dialkylpentadienyl) ruthenium compounds, bis(alkylpentadienyl) ruthenium compounds, bis(pentadienyl) ruthenium compounds, and combinations thereof;
purging the process chamber with a purge gas;
exposing a reducing gas comprising ammonia and atomic hydrogen to the ruthenium-containing compound film on the substrate while forming a ruthenium layer thereon; and
purging the process chamber with the purge gas.

2. The method of claim 1, wherein the ruthenium-containing compound comprises at least one alkyl group selected from the group consisting of methyl, ethyl, propyl, butyl, and combinations thereof.

3. The method of claim 2, wherein the ruthenium-containing compound is selected from the group consisting of bis(2,4-dimethylpentadienyl) ruthenium, bis(2,4-diethylpentadienyl) ruthenium, bis(2,4-diisopropylpentadienyl) ruthenium, bis(2,4-ditertbutylpentadienyl) ruthenium, bis(methylpentadienyl) ruthenium, bis(ethylpentadienyl) ruthenium, bis(isopropylpentadienyl) ruthenium, bis(tertbutylpentadienyl) ruthenium, derivatives thereof, and combinations thereof.

4. The method of claim 1, wherein the reducing gas further comprises a carrier gas selected from the group consisting of nitrogen gas, argon, and combinations thereof.

5. The method of claim 4, wherein the ruthenium layer is formed at a temperature within a range from about 200° C. to about 400° C.

6. The method of claim 5, wherein a thickness of the ruthenium layer is about 20 Å or less.

7. The method of claim 4, wherein the reducing gas further comprises nitrogen gas.

8. The method of claim 7, wherein the ruthenium-containing compound comprises bis(2,4-dimethylpentadienyl) ruthenium.

9. The method of claim 1, wherein the substrate further comprises a barrier layer selected from the group consisting of tantalum, tantalum nitride, tantalum silicon nitride, titanium, titanium nitride, titanium silicon nitride, tungsten, tungsten nitride, and combinations thereof, and the ruthenium layer is deposited on the barrier layer.

10. The method of claim 1, wherein the substrate further comprises at least one low-k material selected from the group consisting of silicon dioxide, silicon nitride, silicon oxynitride, carbon-doped silicon oxides, silicon oxide carbide, and combinations thereof, and the ruthenium layer is deposited on the low-k material.

11. A method for forming a ruthenium material on a substrate surface within a process chamber, sequentially comprising:
exposing a substrate to bis(2,4-dimethylpentadienyl) ruthenium to form a ruthenium-containing film on the substrate;
purging the process chamber with a purge gas;
exposing a reducing gas comprising ammonia to the ruthenium-containing film while forming a ruthenium layer thereon; and
purging the process chamber with the purge gas.

12. The method of claim 11, wherein the reducing gas further comprises a carrier gas selected from the group consisting of nitrogen gas, argon, and combinations thereof.

13. The method of claim 12, wherein the layer is formed at a temperature within a range from about 200° C. to about 400° C.

14. The method of claim 13, wherein a thickness of the ruthenium layer is about 20 Å or less.

15. The method of claim 12, wherein the substrate further comprises a barrier layer comprising a material selected from the group consisting of tantalum, tantalum nitride, tantalum silicon nitride, titanium, titanium nitride, titanium silicon nitride, tungsten, tungsten nitride, and combinations thereof, and the ruthenium layer is deposited on the barrier layer.

16. The method of claim 12, wherein the substrate further comprises at least one low-k material selected from the group consisting of silicon dioxide, silicon nitride, silicon oxynitride, carbon-doped silicon oxides, silicon oxide carbide, and combinations thereof, and the ruthenium layer is deposited on the low-k material.

17. The method of claim 12, wherein the reducing gas further comprises hydrogen gas.

18. The method of claim 17, wherein the reducing gas further comprises atomic-hydrogen.

19. A method for forming a ruthenium material on a substrate, comprising:
depositing a barrier layer on a substrate during a first ALD process, wherein the barrier layer comprises a material selected from the group consisting of tantalum, tantalum nitride, tantalum silicon nitride, titanium, titanium nitride, titanium silicon nitride, tungsten, tungsten nitride, and combinations thereof; and
exposing the substrate sequentially to a ruthenium-containing compound and a reducing gas comprising ammonia to form a ruthenium layer on the barrier layer during a second ALD process, wherein the ruthenium-containing compound is selected from the group consisting of bis(dialkylpentadienyl) ruthenium compounds, bis(alkylpentadienyl) ruthenium compounds, bis(pentadienyl) ruthenium compounds, and combinations thereof.

20. The method of claim 19, wherein the ruthenium-containing compound comprises at least one alkyl group selected from the group consisting of methyl, ethyl, propyl, butyl, and combinations thereof.

21. The method of claim 20, wherein the ruthenium-containing compound is selected from the group consisting of bis(2,4-dimethylpentadienyl) ruthenium, bis(2,4-diethylpentadienyl) ruthenium, bis(2,4-diisopropylpentadienyl) ruthenium, bis(2,4-ditertbutylpentadienyl) ruthenium, bis(methylpentadienyl) ruthenium, bis(ethylpentadienyl) ruthenium, bis(isopropylpentadienyl) ruthenium, bis(tertbutylpentadienyl) ruthenium, derivatives thereof, and combinations thereof.

22. The method of claim 19, wherein the reducing gas further comprises a carrier gas selected from the group consisting of nitrogen gas, argon, and combinations thereof.

23. The method of claim 22, wherein the ruthenium layer is formed at a temperature within a range from about 200° C. to about 400° C.

24. The method of claim 23, wherein a thickness of the ruthenium layer is about 20 Å or less.

25. The method of claim 22, wherein the reducing gas further comprises hydrogen gas.

26. The method of claim 25, wherein the reducing gas further comprises atomic-hydrogen.

27. A method for forming a ruthenium film on a dielectric material disposed on a substrate surface, comprising:
positioning a substrate comprising a dielectric layer thereon within a process chamber;
exposing a ruthenium-containing compound to the dielectric layer while forming a ruthenium-containing compound film thereon, wherein the ruthenium-containing compound is selected from the group consisting of bis(dialkylpentadienyl) ruthenium compounds, bis(alkylpentadienyl) ruthenium compounds, bis(pentadienyl) ruthenium compounds, and combinations thereof;
purging the process chamber with a purge gas;
exposing a reducing gas comprising ammonia to the ruthenium-containing compound film on the dielectric layer while forming a ruthenium layer thereon; and
purging the process chamber with the purge gas.

28. The method of claim 27, wherein the ruthenium-containing compound comprises at least one alkyl group selected from the group consisting of methyl, ethyl, propyl, butyl, and combinations thereof.

29. The method of claim 28, wherein the ruthenium-containing compound is selected from the group consisting of bis(2,4-dimethylpentadienyl) ruthenium, bis(2,4-diethylpentadienyl) ruthenium, bis(2,4-diisopropylpentadienyl) ruthenium, bis(2,4-ditertbutylpentadienyl) ruthenium, bis(methylpentadienyl) ruthenium, bis(ethylpentadienyl) ruthenium, bis(isopropylpentadienyl) ruthenium, bis(tertbutylpentadienyl) ruthenium, derivatives thereof, and combinations thereof.

30. The method of claim 27, wherein the reducing gas further comprises a carrier gas selected from the group consisting of nitrogen gas, argon, and combinations thereof.

31. The method of claim 30, wherein the ruthenium layer is formed at a temperature within a range from about 200° C. to about 400° C.

32. The method of claim 31, wherein a thickness of the ruthenium layer is about 20 Å or less.

33. The method of claim 30, wherein the reducing gas further comprises hydrogen gas.

34. The method of claim 33, wherein the reducing gas further comprises atomic-hydrogen.

35. The method of claim 27, wherein the dielectric layer comprises at least one low-k material selected from the group consisting of silicon dioxide, silicon nitride, silicon oxynitride, carbon-doped silicon oxides, silicon oxide carbide, and combinations thereof.

36. A method for forming a ruthenium material on a substrate surface, comprising:
positioning a substrate within a process chamber;
exposing the substrate to a ruthenium-containing compound comprising ruthenium and at least one open chain dienyl ligand while forming a ruthenium-containing compound film thereon;
purging the process chamber with a purge gas;
exposing the ruthenium-containing compound film to a reducing gas comprising ammonia and hydrogen gas while forming a ruthenium layer on the substrate; and
purging the process chamber with the purge gas.

37. The method of claim 36, wherein the ruthenium-containing compound is selected from the group consisting of bis(dialkylpentadienyl) ruthenium compounds, bis(alkylpentadienyl) ruthenium compounds, bis(pentadienyl) ruthenium compounds, and combinations thereof.

38. The method of claim 37, wherein the ruthenium-containing compound comprises at least one alkyl group selected from the group consisting of methyl, ethyl, propyl, butyl, and combinations thereof.

39. The method of claim 38, wherein the ruthenium-containing compound is selected from the group consisting of bis(2,4-dimethylpentadienyl) ruthenium, bis(2,4-diethylpentadienyl) ruthenium, bis(2,4-diisopropylpentadienyl) ruthenium, bis(2,4-ditertbutylpentadienyl) ruthenium, bis(methylpentadienyl) ruthenium, bis(ethylpentadienyl) ruthenium, bis(isopropylpentadienyl) ruthenium, bis(tertbutylpentadienyl) ruthenium, derivatives thereof, and combinations thereof.

40. The method of claim 36, wherein the ruthenium layer is formed at a temperature within a range from about 200° C. to about 400° C.

41. The method of claim 40, wherein a thickness of the ruthenium layer is about 20 Å or less.

42. The method of claim 36, wherein the reducing gas further comprises nitrogen gas.

43. The method of claim 42, wherein the reducing gas further comprises atomic-hydrogen.

44. A method for forming a ruthenium material on a low-k material disposed on a substrate surface, comprising:
positioning a substrate comprising a low-k layer disposed thereon within a process chamber;
heating the substrate to a temperature within a range from about 200° C. to about 400° C.;
exposing the low-k layer to a ruthenium-containing compound comprising ruthenium and at least one open chain dienyl ligand while forming a ruthenium-containing compound film thereon;
purging the process chamber with a purge gas;
exposing the ruthenium-containing compound film to a reducing gas comprising ammonia while forming a ruthenium layer on the low-k layer; and
purging the process chamber with the purge gas.

45. The method of claim 44, wherein the temperature is within a range from about 300° C. to about 350° C.

46. The method of claim 45, wherein a thickness of the ruthenium layer is about 20 Å or less.

47. The method of claim 44, wherein the low-k layer comprises at least one material selected from the group consisting of silicon dioxide, silicon nitride, silicon oxynitride, carbon-doped silicon oxides, silicon oxide carbide, and combinations thereof.

48. The method of claim 44, wherein the reducing gas further comprises hydrogen gas and nitrogen gas.

49. The method of claim 48, wherein the reducing gas further comprises atomic-hydrogen.

50. The method of claim 44, wherein the ruthenium-containing compound is selected from the group consisting of bis(dialkylpentadienyl) ruthenium compounds, bis(alkylpentadienyl) ruthenium compounds, bis(pentadienyl) ruthenium compounds, and combinations thereof.

51. The method of claim 50, wherein the ruthenium-containing compound comprises at least one alkyl group selected from the group consisting of methyl, ethyl, propyl, butyl, and combinations thereof.

52. The method of claim 51, wherein the ruthenium-containing compound is selected from the group consisting of bis(2,4-dimethylpentadienyl) ruthenium, bis(2,4-diethylpentadienyl) ruthenium, bis(2,4-diisopropylpentadienyl) ruthenium, bis(2,4-ditertbutylpentadienyl) ruthenium, bis(methylpentadienyl) ruthenium, bis(ethylpentadienyl) ruthenium, bis(isopropylpentadienyl) ruthenium, bis(tertbutylpentadienyl) ruthenium, derivatives thereof, and combinations thereof.

53. A method for forming a ruthenium material on a low-k material disposed on a substrate surface, comprising:
    positioning a substrate comprising a low-k layer disposed thereon within a process chamber;
    heating the substrate to a temperature within a range from about 200° C. to about 400° C.;
    exposing the low-k layer to bis(2,4-dimethylpentadienyl) ruthenium to form a ruthenium-containing compound film thereon;
    purging the process chamber with a purge gas;
    exposing the ruthenium-containing compound film to a reducing gas comprising ammonia and atomic hydrogen while forming a ruthenium layer on the low-k layer; and
    purging the process chamber with the purge gas.

54. The method of claim 53, wherein the reducing gas further comprises nitrogen gas.

55. A method for forming a ruthenium material on a barrier material layer disposed on a substrate surface, comprising:
    positioning a substrate comprising a tantalum-containing barrier layer disposed thereon within a process chamber;
    heating the substrate to a temperature within a range from about 200° C. to about 400° C.;
    exposing the tantalum-containing barrier layer to bis(2,4-dimethylpentadienyl) ruthenium while forming a ruthenium-containing compound film thereon;
    purging the process chamber with a purge gas;
    exposing the ruthenium-containing compound film to a reducing gas comprising ammonia and atomic hydrogen while forming a ruthenium layer on the tantalum-containing barrier layer; and
    purging the process chamber with the purge gas.

* * * * *